(12) United States Patent
Kamiya

(10) Patent No.: US 10,682,768 B2
(45) Date of Patent: Jun. 16, 2020

(54) FORCE DETECTION SENSOR, FORCE SENSOR, TORQUE SENSOR, AND ROBOT

(71) Applicant: Seiko Epson Corporation, Tokyo (JP)

(72) Inventor: Toshiyuki Kamiya, Fujimi (JP)

(73) Assignee: Seiko Epson Corporation (JP)

( * ) Notice: Subject to any disclaimer, the term of this patent is extended or adjusted under 35 U.S.C. 154(b) by 136 days.

(21) Appl. No.: 15/805,777

(22) Filed: Nov. 7, 2017

(65) Prior Publication Data

US 2018/0141217 A1 May 24, 2018

(30) Foreign Application Priority Data

Nov. 24, 2016 (JP) ................. 2016-228406

(51) Int. Cl.
| | |
|---|---|
| *G01L 3/00* | (2006.01) |
| *G01L 5/00* | (2006.01) |
| *B25J 13/08* | (2006.01) |
| *G01L 1/16* | (2006.01) |
| *G01G 3/13* | (2006.01) |

(Continued)

(52) U.S. Cl.
CPC ............. *B25J 13/085* (2013.01); *G01G 3/13* (2013.01); *G01G 3/165* (2013.01); *G01L 1/165* (2013.01); *G01L 1/167* (2013.01); *G01L 5/226* (2013.01); *H01L 41/047* (2013.01)

(58) Field of Classification Search
CPC ...... B60N 2/002; B60N 2/646; B60N 2/7094; B60N 2/64; G01G 19/08; G01G 19/4142; G01L 1/142; G01L 1/205; B60R 21/01524; B60R 21/01516; H01H 13/78; H01H 2201/038; H01H 2205/016; H01H 2225/018; H01H 2203/038; H01H 13/807; H01H 2215/004; H01H 225/03; H03K 17/9625; H01C 10/10; H04M 1/23
See application file for complete search history.

(56) References Cited

U.S. PATENT DOCUMENTS

| | | | | |
|---|---|---|---|---|
| 4,623,813 A | * | 11/1986 | Naito | ................. G01G 3/13 |
| | | | | 177/210 FP |
| 5,827,980 A | | 10/1998 | Doemens et al. | |

(Continued)

FOREIGN PATENT DOCUMENTS

| | | |
|---|---|---|
| JP | 60-133320 A | 7/1985 |
| JP | 05-322670 A | 12/1993 |

(Continued)

OTHER PUBLICATIONS

Extended European Search Report for Patent Application No. EP17203041.3, dated Apr. 26, 2018 (8 pages).

*Primary Examiner* — Brandi N Hopkins
(74) *Attorney, Agent, or Firm* — Harness, Dickey & Pierce, P.L.C.

(57) ABSTRACT

A force detection sensor includes a base member having a first surface subjected to an external force and a second surface having a normal direction different from the first surface, and electrode fingers placed on the second surface, wherein an arrangement direction of the electrode fingers is different from the normal direction of the first surface in a plan view of the second surface. Further, the second surface includes a surface of a piezoelectric material. A constituent material of the piezoelectric material is quartz crystal. The first surface crosses an electrical axis of the quartz crystal.

10 Claims, 15 Drawing Sheets

(51) Int. Cl.
*G01G 3/16* (2006.01)
*G01L 5/22* (2006.01)
*H01L 41/047* (2006.01)

(56) References Cited

U.S. PATENT DOCUMENTS

| | | | |
|---|---|---|---|
| 2013/0152700 A1 | 6/2013 | Kamiya et al. | |
| 2013/0233089 A1* | 9/2013 | Kawai | B25J 13/085 |
| | | | 73/862.68 |
| 2014/0053660 A1* | 2/2014 | Kamiya | G01L 1/16 |
| | | | 73/862.68 |
| 2014/0236354 A1 | 8/2014 | Kamiya et al. | |
| 2014/0366646 A1* | 12/2014 | Matsuzawa | G01L 1/16 |
| | | | 73/862.68 |
| 2015/0120051 A1* | 4/2015 | Matsuzawa | H01L 41/1132 |
| | | | 700/258 |
| 2015/0357551 A1 | 12/2015 | Teshigahara et al. | |

FOREIGN PATENT DOCUMENTS

| | | |
|---|---|---|
| JP | 2002-031574 A | 1/2002 |
| JP | 2005-184340 A | 7/2005 |
| JP | 2006-275999 A | 10/2006 |
| JP | 2008-542701 A | 11/2008 |
| JP | 2010-139506 A | 6/2010 |
| JP | 2013-130431 A | 7/2013 |
| JP | 2014-163870 A | 9/2014 |
| JP | 2015-230244 A | 12/2015 |
| WO | WO-2006-125941 A1 | 11/2006 |

\* cited by examiner

FORCE DETECTION SENSOR, FORCE SENSOR, TORQUE SENSOR, AND ROBOT

BACKGROUND

1. Technical Field

The present invention relates to a force detection sensor, a force sensor, a torque sensor, and a robot.

2. Related Art

For example, as a force detection sensor, a configuration using vibrators is known (e.g. Patent Document 1 (JP-A-2002-31574)). The force detection sensor described in Patent Document 1 has a substrate and a first vibrator and a second vibrator stacked on the substrate. When the first vibrator is vibrated and the second vibrator is pressed by an object, the vibration of the first vibrator is easily transmitted to the second vibrator by the amount of pressing and a signal having the same frequency as the first vibrator is output from the second vibrator with an amplitude according to the pressing force.

However, in the force detection sensor, a minor change in amplitude according to a minor change in pressing force is hard to appear in the signal output from the second vibrator, and it is difficult to exert a high force detection property.

SUMMARY

An advantage of some aspects of the invention is to provide a force detection sensor having a higher force detection property, a force sensor, a torque sensor, and a robot.

The advantage can be achieved by the following configurations.

A force detection sensor according to an aspect of the invention includes a base member having a first surface subjected to an external force and a second surface having a normal direction different from the first surface, and electrode fingers placed on the second surface, wherein an arrangement direction of the electrode fingers tilts with respect to the normal direction of the first surface in a plan view of the second surface.

With this configuration, when the first surface is subjected to a force, the pitch of the electrode fingers changes. When the pitch of the electrode fingers changes, the frequency of surface acoustic wave excited in the surface of the base member (the resonance frequency of an SAW resonator) by energization of the electrode fingers also changes. Accordingly, the applied force may be detected based on the frequency change. In the above described manner, the applied force is detected based on the frequency change, and thereby, higher resolution and responsiveness may be exerted. Therefore, the force detection sensor that may exert a higher force detection property is obtained.

In the force detection sensor according to the aspect of the invention, it is preferable that the second surface includes a surface of a piezoelectric material.

With this configuration, the electrode fingers are energized, and surface acoustic wave may be excited in the second surface more reliably.

In the force detection sensor according to the aspect of the invention, it is preferable that the base member has a third surface having a normal direction different from the first surface and the second surface, the electrode fingers are placed on the third surface, and an arrangement direction of the electrode fingers placed on the third surface is different from the normal direction of the first surface in a plan view of the third surface.

With this configuration, the force detection sensor having more detection axes is obtained.

In the force detection sensor according to the aspect of the invention, it is preferable that the third surface includes a surface of a piezoelectric material.

With this configuration, the electrode fingers are energized, and surface acoustic wave may be excited in the third surface more reliably.

In the force detection sensor according to the aspect of the invention, it is preferable that, in the plan view of the second surface, first electrode fingers in an arrangement direction tilting toward one side with respect to a normal line of the first surface and second electrode fingers in an arrangement direction tilting toward the other side with respect to the normal line of the first surface are provided.

With this configuration, the force detection sensor having more detection axes is obtained.

In the force detection sensor according to the aspect of the invention, it is preferable that a constituent material of the piezoelectric material is quartz crystal.

With this configuration, excellent temperature characteristics and an excellent mechanical strength may be exerted.

In the force detection sensor according to the aspect of the invention, it is preferable that the first surface crosses an electrical axis of the quartz crystal.

With this configuration, surface acoustic wave may be excited in the surfaces (second surface and third surface) of the base member more reliably.

In the force detection sensor according to the aspect of the invention, it is preferable that the base member has a first base member and a second base member connected to the first base member, the first base member has the first surface, and the second base member has the second surface.

With this configuration, the degree of freedom of design of the base member increases.

In the force detection sensor according to the aspect of the invention, it is preferable that the base member is pressurized.

With this configuration, responsiveness of the force detection sensor is improved.

A force sensor according to an aspect of the invention includes the force detection sensor according to the aspect of the invention.

With this configuration, the force sensor that may enjoy the advantages of the force detection sensor according to the aspect of the invention with higher reliability and force detection property is obtained.

A torque sensor according to an aspect of the invention includes the force detection sensor according to the aspect of the invention.

With this configuration, the torque sensor that may enjoy the advantages of the force detection sensor according to the aspect of the invention with higher reliability and force detection property is obtained.

A robot according to an aspect of the invention includes the force detection sensor according to the aspect of the invention.

With this configuration, the robot that may enjoy the advantages of the force detection sensor according to the aspect of the invention with higher reliability and force detection property is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a force detection sensor and a robot according to the invention will be explained in detail based on preferred embodiments shown in the accompanying drawings.

First Embodiment

Figure 1:
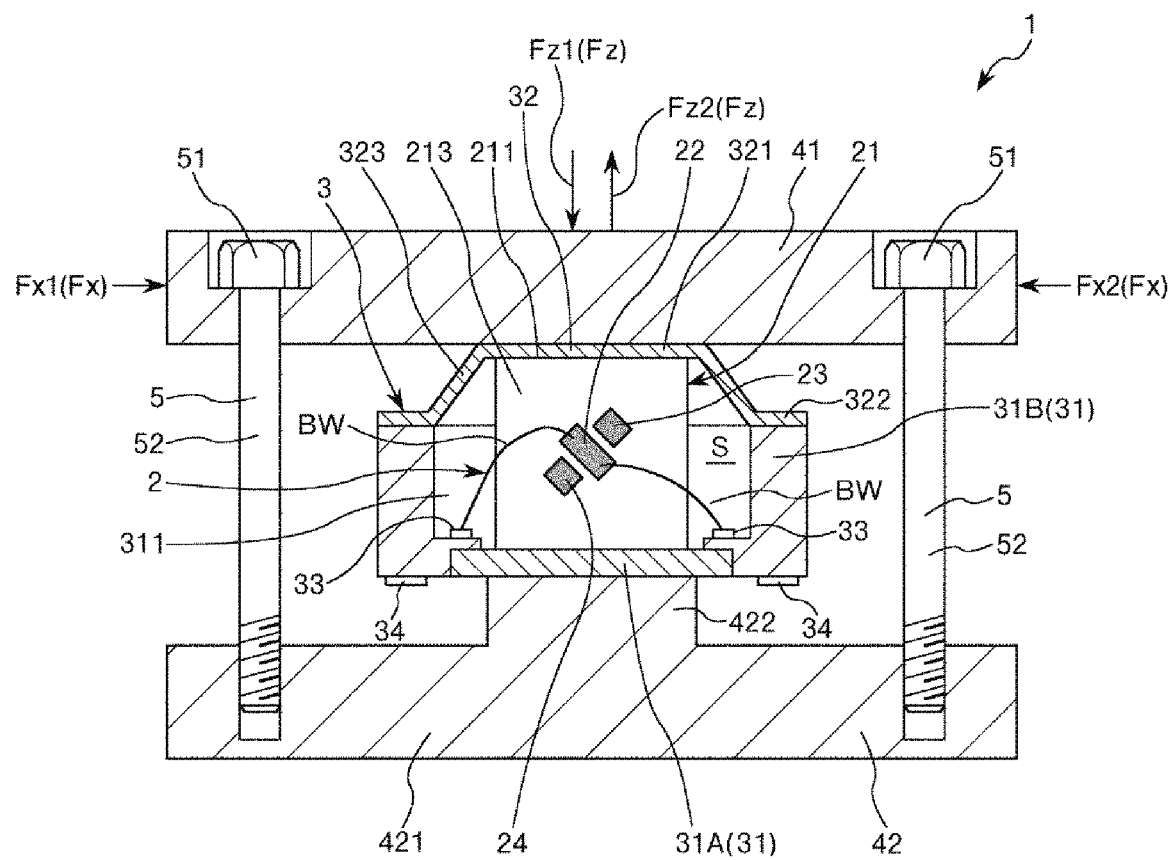
FIG. 1 is a sectional view showing a force sensor according to a first embodiment of the invention.
Figure 2:
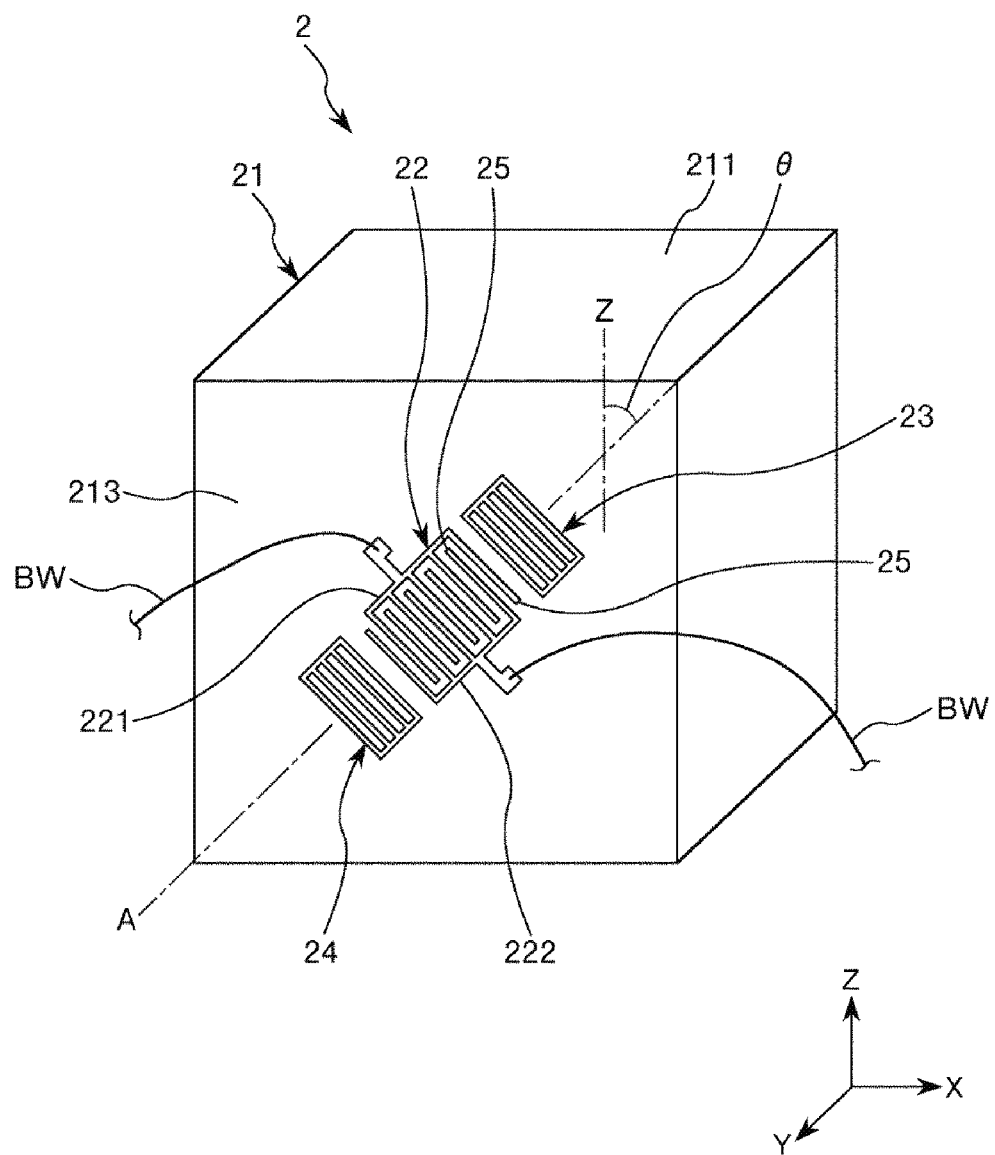
FIG. 2 is a perspective view of a force detection sensor of the force sensor shown in FIG. 1.
Figure 3:
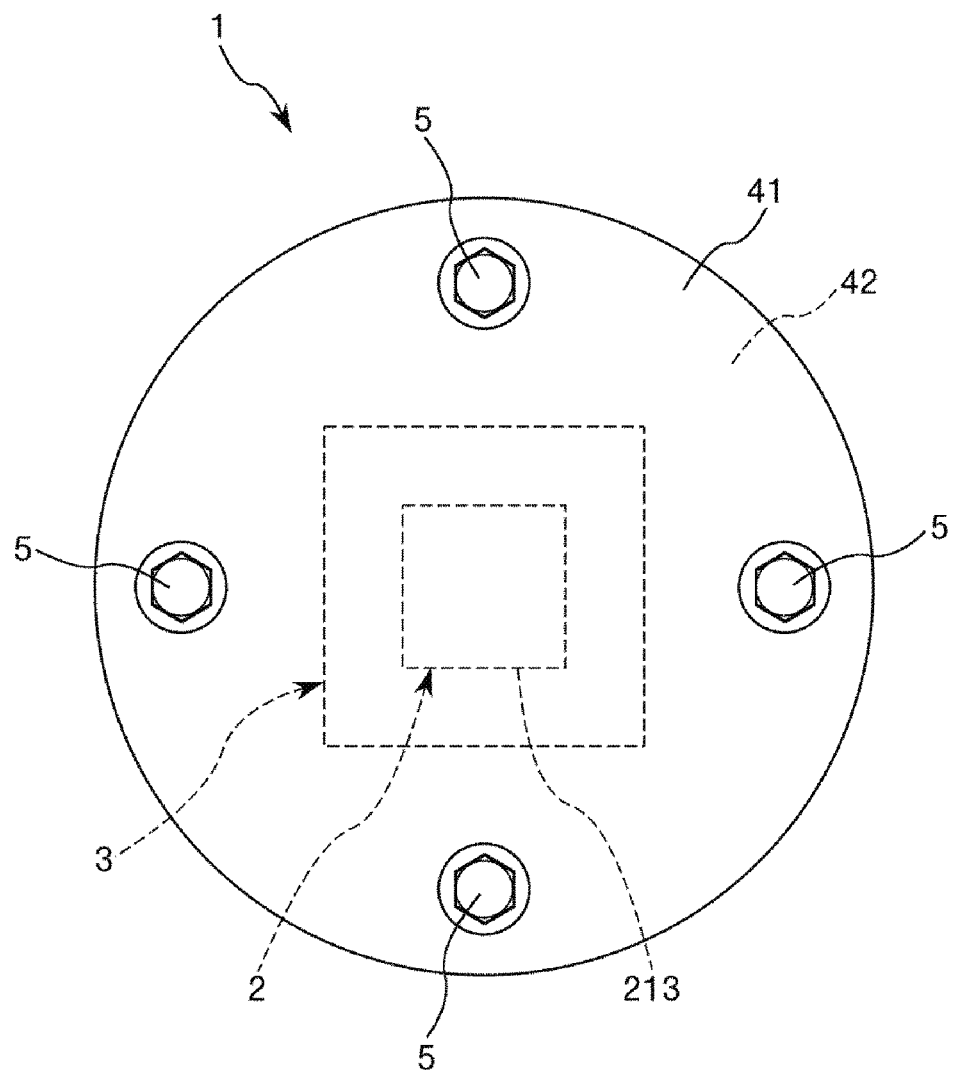
FIG. 3 is a plan view of the force sensor shown in FIG. 1.

FIG. 1 is a sectional view showing a force sensor according to the first embodiment of the invention. FIG. 2 is a perspective view of a force detection sensor of the force sensor shown in FIG. 1. FIG. 3 is a plan view of the force sensor shown in FIG. 1. Hereinafter, for convenience of explanation, the upside in FIGS. 1 and 2 and the near side of the paper in FIG. 3 are also referred to as "upper" and the downside in FIGS. 1 and 2 and the far side of the paper in FIG. 3 are also referred to as "lower". Further, as shown in the respective drawings, hereinafter, three axes orthogonal to one another are referred to as "X-axis", "Y-axis", and "Z-axis", and directions parallel to the X-axis are also referred to as "X-axis directions", directions parallel to the Y-axis are also referred to as "Y-axis directions", and directions parallel to the Z-axis are also referred to as "Z-axis directions".

A force sensor 1 shown in FIG. 1 may detect a force Fz (Fz1, Fz2) in the Z-axis directions and a force Fx (Fx1, Fx2) in the X-axis directions. The force sensor 1 has a force detection sensor 2, a package 3 housing the force detection sensor 2, a pair of substrates 41, 42 provided to sandwich the package 3 in the thickness direction, and pressurization bolts 5 that couple the substrates 41, 42 and pressurize the force detection sensor 2 via the package 3. As below, these respective parts will be sequentially explained.

Force Detection Sensor

As shown in FIGS. 1 and 2, the force detection sensor 2 has a base member 21 including a pressure receiving surface 211 as a first surface subjected to an external force (Fz, Fx) and a placement surface 213 as a second surface having a different normal direction from the pressure receiving surface 211, and electrode fingers 25 placed on the placement surface 213. In the plan view of the placement surface 213, the arrangement direction of the electrode fingers 25 is different from the normal direction of the pressure receiving surface 211 (Z-axis direction). That is, in the plan view of the placement surface 213, the arrangement direction of the electrode fingers 25 tilts with respect to the normal line of the pressure receiving surface 211.

The force detection sensor 2 forms an SAW resonator that may excite surface acoustic wave in the surface of the base member 21. When the force Fz or force Fx is applied, the base member 21 deforms and the pitch of the electrode fingers 25 (intervals between the adjacent electrode fingers 25, i.e., intervals between the electrode fingers 25 in the direction in which surface acoustic wave propagates) changes with the deformation of the base member 21. When the pitch of the electrode fingers 25 changes, the frequency of the surface acoustic wave (the resonance frequency of the SAW resonator) changes with the change. This is because the frequency of the surface acoustic wave depends on the pitch of the electrode fingers 25. Accordingly, the forces Fz, Fz may be detected based on the frequency of the surface acoustic wave excited by the force detection sensor 2. As described above, according to the configuration that detects the applied force based on the frequency change, higher resolution and higher responsiveness may be exerted. Therefore, the force detection sensor 2 that may exert a higher force detection property is obtained. Particularly, in the embodiment, the arrangement direction of the electrode fingers 25 is tilted with respect to the Z-axis, and both the force Fz and the force Fx may be detected. As below, the force detection sensor 2 will be explained in detail.

As shown in FIG. 2, the force detection sensor 2 has the base member 21, an inter-digital electrode 22 provided in the base member 21, and a pair of reflectors 23, 24 provided with the inter-digital electrode 22 in between on the placement surface 213. The inter-digital electrode 22 is also the comb-like electrode.

The base member 21 is a quadrangular prism (cubic in the embodiment). Further, the base member 21 has a top surface and a bottom surface, and four side surfaces connecting the top surface and the bottom surface. Of the surfaces, the top surface of the base member 21 is formed by an XY-plane with a normal line along the Z-axis and forms the pressure receiving surface 211 as the first surface subjected to the forces Fz, Fx. Further, one of the four side surfaces is formed by an XZ-plane with a normal line along the Y-axis and forms the placement surface 213 as the second surface on which the inter-digital electrode 22 and the reflectors 23, 24 are placed.

The placement surface 213 deforms when the pressure receiving surface 211 is subjected to the forces Fz, Fx. The placement surface 213 deforms, and thereby, the pitch of the inter-digital electrode 22 changes and the frequency of the surface acoustic wave (the resonance frequency of the SAW resonator) changes according to the change. Note that "deformation" here has a broad concept including e.g. the case of not substantial deformation, but with internal distortion (the same applies to the following description).

Particularly, in the embodiment, the surface adjacent to (i.e., the surface connected to without a different surface in between) the pressure receiving surface 211 is used as the placement surface 213. Accordingly, the forces Fz, Fx applied to the pressure receiving surface 211 are easily transmitted to the placement surface 213. Therefore, the placement surface 213 may be deformed more reliably and more largely. Therefore, the amount of change of the frequency with respect to the magnitude of the applied force may be made larger. As a result, resolution of the force detection sensor 2 is further improved.

Note that the shape of the base member 21 is not particularly limited as long as the base member has the pressure receiving surface 211 (first surface) and the placement surface 213 (second surface) on which the inter-digital electrode 22 is provided, but may be e.g. a polygonal prism such as a triangular prism, pentagonal prism, hexagonal prism or the like. Further, the respective surfaces of the base member 21 including the pressure receiving surface 211 and the placement surface 213 are not limited to flat surfaces, but entire or part of the surfaces may be curved surfaces.

The base member 21 is formed by a piezoelectric material. Accordingly, the placement surface 213 includes a surface of the piezoelectric material. Thereby, the surface acoustic wave may be excited more reliably. Note that the constituent material of the piezoelectric material is not particularly limited, but includes e.g. quartz crystal, lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), potassium sodium niobate ((K,Na)$NbO_3$), bismuth ferrite ($BiFeO_3$), sodium niobate ($NaNbO_3$), bismuth titanate ($Bi_4Ti_3O_{12}$), and sodium bismuth titanate ($Na_{0.5}Bi_{0.5}TiO_3$).

Particularly, in the embodiment, the constituent material of the piezoelectric material is quartz crystal. That is, the base member 21 is formed of quartz crystal. Thereby, the force detection sensor 2 may exert higher frequency stability, better frequency-temperature characteristics (the amount of change of the frequency is smaller in a certain temperature range), higher mechanical strength (rigidity, load bearing), higher natural frequency, and higher dynamic range compared to the case using another piezoelectric material. Accordingly, the forces Fz, Fx may be detected in a wider range with higher accuracy. Therefore, the force detection sensor 2 having a better detection property is obtained.

The pressure receiving surface 211 crosses the electrical axis of the quartz crystal as the piezoelectric material. Specifically, in the embodiment, the pressure receiving surface 211 is orthogonal to the electrical axis of the quartz crystal. That is, the pressure receiving surface 211 is the X-cut face of the quartz crystal. The placement surface 213 is parallel to the electrical axis of the quartz crystal. The quartz crystal with the cut angle is used, and thereby, surface acoustic wave may be excited more reliably. The cut angle of the quartz crystal forming the base member 21 includes e.g. ST cut, CT cut, AT cut, and BT cut, and the ST cut is preferably used. The cut angle is used, and thereby, surface acoustic wave called Rayleigh wave may be used and, for example, compared to surface acoustic wave called leaky wave, variations in frequency and frequency-temperature characteristics for the processing accuracy of the base member 21 and the inter-digital electrode 22 may be made smaller. Accordingly, mass productivity is excellent. However, the cut angle of the quartz crystal is not particularly limited as long as surface acoustic wave may be excited.

The inter-digital electrode 22 is provided in the center part in the Z-axis direction of the placement surface 213 of the base member 21. Further, the inter-digital electrode 22 has a pair of electrodes 221, 222. The pair of electrodes 221, 222 are placed so that their electrode fingers 25 may mesh with each other. That is, the electrodes 221, 222 are placed so that their electrode fingers 25 may be alternately arranged without contact. When a drive voltage is applied between the electrodes 221, 222, cyclical strain is generated between the electrode fingers 25 due to the piezoelectric effect of the base member 21, and surface acoustic wave is excited along the arrangement direction of the electrode fingers 25. Note that, in the embodiment, the extension direction of the electrode fingers 25 and the arrangement direction of the electrode fingers 25 are orthogonal, however, the directions are not necessarily orthogonal as long as surface acoustic wave may be excited.

In the plan view of the placement surface 213, the arrangement direction of the electrode fingers 25 of the inter-digital electrode 22 tilts with respect to the normal line (Z-axis) of the pressure receiving surface 211. That is, in the plan view of the placement surface 213, supposing that the axis along the arrangement direction of the electrode fingers 25 of the inter-digital electrode 22 is an axis A, the axis A tilts with respect to the normal line (Z-axis) of the pressure receiving surface 211. Further, the axis A also tilts with respect to the X-axis. The tilt angle θ of the axis A with respect to the Z-axis is not particularly limited, but preferably from 30° to 60° and more preferably from 40° to 50°, for example. The angle is set as above, and thereby, even when any one of the forces Fz, Fx is applied, the pitch of the inter-digital electrode 22 may be changed more largely. Therefore, the forces Fz, Fx may be respectively detected with higher sensitivity.

The pair of reflectors 23, 24 are placed on both sides with the inter-digital electrode 22 in between. The reflectors 23, 24 have a function of reflecting the surface acoustic wave propagating in the base member 21 and containing the surface acoustic wave between the reflector 23 and the reflector 24. Note that the reflectors 23, 24 may be omitted.

The inter-digital electrode 22 and the reflectors 23, 24 may be respectively formed using metal materials having better conductivity including aluminum (Al) and aluminum alloys. The aluminum (Al) and the aluminum alloys are materials having smaller specific gravity than other metal materials such as copper (Cu) or tungsten (W), for example, and thus, the influence by the dimension variations of the inter-digital electrode 22 and the reflectors 23, 24 on the frequency-temperature characteristics of the force detection sensor 2 may be suppressed to be smaller.

As above, the force detection sensor 2 is explained. Note that, in the embodiment, the force detection sensor 2 is the so-called single-port SAW resonator with the single inter-digital electrode 22, however, not limited to that. The so-called dual-port SAW resonator with the two inter-digital electrodes 22 provided along the propagation direction of surface acoustic wave may be used. Or, another configuration may be employed.

Package

As shown in FIG. 1, the package 3 includes a base 31 having a concave portion 311 opening upward and a cap-shaped lid 32 joined to the upper surface of the base 31 to cover the opening of the concave portion 311. Further, an air-tight housing space S is formed inside of the package 3, and the force detection sensor 2 is housed in the housing space S. The atmosphere in the housing space S is not particularly limited, but the space is preferably filled with e.g. a rare gas such as nitrogen, argon, or helium. Thereby, the atmosphere in the housing space S is stable. Further, corrosion of the inter-digital electrode 22 and the reflectors 23, 24 or the like may be suppressed. The housing space S may be depressurized (preferably, in vacuum). Thereby, for example, the viscosity resistance is reduced and the Q-value of the force detection sensor 2 becomes higher, and surface acoustic wave is easily excited.

The lower surface of the base member 21 is joined to the concave portion 311 (an upper surface of a foundation 31A), and the upper surface of the base member 21 (pressure receiving surface 211) is joined to the lid 32. The base 31 and lid 32 and the force detection sensor 2 are joined using e.g. an insulating adhesive. Note that the joining method of the base 31 and lid 32 and the force detection sensor 2 is not particularly limited. The force detection sensor 2 and the package 3 are not necessarily joined as long as the force detection sensor 2 may be fixed within the housing space S, for example.

As shown in FIG. 1, the lid 32 has a center portion 321 located in the center part and joined to the force detection sensor 2, an outer edge portion 322 located in the outer edge part and joined to the base 31, and a tapered connecting portion 323 located between the center portion 321 and the outer edge portion 322 and connecting the portions. The center portion 321 is located on the upside (substrate 41 side) of the outer edge portion 322. Only the center portion 321 is in contact with the substrate 41, and the outer edge portion 322 and the connecting portion 323 are not in contact with (separated from) the substrate 41. Thereby, the forces Fz, Fx may be transmitted to the pressure receiving surface 211 of the force detection sensor 2 more reliably and efficiently.

Note that, in the state in which the package 3 is not pressurized by the pressurization bolts 5, the force detection sensor 2 may be pressurized in the Z-axis direction by the package 3 or not. It is preferable that the sensor is not substantially pressurized. Thereby, for example, compared to the case where the sensor is pressurized by the package 3, the rigidity of the package 3 may be lower and the package 3 may be downsized. In the embodiment, the height of the housing space S and the height of the force detection sensor 2 are nearly equal, and, in the state in which the sensor is housed in the package 3, the force detection sensor 2 is not substantially pressurized by the package 3.

As shown in FIG. 1, in the embodiment, the base 31 has the foundation 31A forming the bottom center part of the base 31 and a frame portion 31B provided around the foundation 31A and forming the outer edge portion and the side wall of the bottom part of the base 31. The force detection sensor 2 is mounted on the upper surface of the foundation 31A. That is, the foundation 31A functions as a mount on which the force detection sensor 2 is mounted.

In the frame portion 31B, two internal terminals 33 located within the housing space S and two external terminals 34 located on the lower surface of the base 31 and electrically connected to the internal terminals 33 by internal wiring (not shown) are provided. The internal terminals 33, 33 are respectively electrically connected to the electrodes 221, 222 of the inter-digital electrode 22 via bonding wires BW. According to the configuration, the inter-digital electrode 22 may be electrically led to the outside of the package 3, and electrical connection to an external apparatus may be made more easily.

The constituent material of the frame portion 31B is not particularly limited, but e.g. various ceramics such as aluminum oxide may be used. The constituent materials of the foundation 31A and the lid 32 are respectively not particularly limited, but e.g. members having coefficients of linear expansion close to that of the constituent material of the frame portion 31B may be preferably used. For example, in the case where the constituent material of the frame portion 31B is the above described ceramics, it is preferable that the constituent materials of the foundation 31A and the lid 32 are metal materials (e.g. alloys including kovar). Thereby, generation of thermal strain is harder in the package 3 and application of unnecessary stress (pressurization, other external forces than the forces Fz, Fx) to the force detection sensor 2 may be reduced. Accordingly, the force sensor 1 with higher force detection accuracy is obtained.

As described above, the foundation 31A and the lid 32 are respectively formed using the metal materials, and thereby, strength and dimension accuracy of the foundation 31A and the lid 32 may be higher, and the sufficient mechanical strength may be exerted and the height of the housing space S may be controlled with higher accuracy. Accordingly, the package 3 may be harder to break and the force detection sensor 2 may be preferably housed in the housing space S. On the other hand, the frame portion 31B is formed using the ceramics, and thereby, the strength of the frame portion 31B may be made higher and the whole strength of the package 3 may be increased. Further, the frame portion 31B may be insulated and formation of the internal terminals 33 and the external terminals 34 may be easier.

Substrates

As shown in FIG. 1, the pair of substrates 41, 42 are provided to overlap in the Z-axis direction with the package 3 in between. The package 3 is located in the center parts of the substrates 41, 42 in a plan view as seen from the Z-axis direction.

The substrate 41 is located on the upside of the package 3 and has a plate-like shape. The lower surface of the substrate 41 is in contact with the center portion 321 of the lid 32. On the other hand, the substrate 42 is located on the downside of the package 3 and has a plate-like base 421 and a projecting portion 422 projecting upward from the base 421. The upper surface of the projecting portion 422 is in contact with the lower surface of the base 31. Further, the projecting portion 422 is in contact with the lower surface of the foundation 31A of the base 31, but not in contact with the frame portion 31B. Thereby, the forces Fz, Fx may be transmitted to the force detection sensor 2 more reliably and efficiently. Accordingly, the force sensor 1 with higher force detection accuracy is obtained. Further, air gaps are formed between the substrate 42 and the external terminals 34, and connection between the external terminals 34 and an external apparatus is easier.

The constituent materials of the substrates 41, 42 are not particularly limited, but e.g. various metals including iron, nickel, cobalt, gold, platinum, silver, copper, manganese, aluminum, magnesium, zinc, lead, tin, titanium, tungsten, alloys or intermetallic compounds containing at least one kind of the metals, or oxides, nitrides, carbides, etc. of the metals are used.

Pressurization Bolts

As shown in FIGS. 1 and 3, the substrates 41, 42 are secured (coupled) using the four pressurization bolts 5. The four pressurization bolts 5 are provided at equal intervals (i.e., intervals of 90 degrees) in the outer edge parts of the substrates 41, 42 along the circumferential direction. Further, the respective pressurization bolts 5 are placed so that head portions 51 thereof may be on the substrate 41 side and thread portions 52 of the respective pressurization bolts 5 are screwed into the substrate 42. By the respective pressurization bolts 5, pressure in the Z-axis direction is applied to the force detection sensor 2 within the package 3. That is, the base member 21 is pressurized by the pressurization bolts 5. As described above, the base member 21 is pressurized, and thereby, for example, compared to the case without pressurization, responsiveness of the force sensor 1 is improved. Further, not only the compression force Fz1 but also the tensile force Fz2 may be detected more accurately.

According to the pressurization bolts 5, the magnitude of pressurization may be adjusted by the amount of tightening of the pressurization bolts 5. Accordingly, adjustment of pressurization is easier. The magnitude of pressurization is not particularly limited, but may be appropriately set according to the strength of the force detection sensor 2 or the like. Note that the number and arrangement of the pressurization bolts 5 are not particularly limited as long as the bolts may pressurize the force detection sensor 2. Or, the method is not limited to the method using the pressurization bolts 5 as long as the base member 21 may be pressurized.

As above, the configuration of the force sensor 1 is explained. The force sensor 1 may detect the force Fz (Fz1, Fz2) in the Z-axis directions (the directions orthogonal to the pressure receiving surface 211) and the force Fx (Fx1, Fx2) in the X-axis directions (the directions parallel to the pressure receiving surface 211) as described above. As below, a force detection method of the force sensor 1 will be explained. Note that, hereinafter, a state in which another external force than pressurization is not substantially applied to the force detection sensor 2 is also referred to as "natural state". Further, hereinafter, the forces Fz, Fx act on the pressure receiving surface 211 via the substrate 41 with the substrate 42 fixed.

When the force Fz1 is applied to the pressure receiving surface 211, the base member 21 compressively deforms in the Z-axis direction and the pitch of the inter-digital electrode 22 (the intervals of the adjacent electrode fingers 25, i.e., the intervals between the electrode fingers 25 in the direction in which surface acoustic wave propagates) becomes shorter than that in the natural state. Accordingly, the frequency f of the surface acoustic wave excited in the force detection sensor 2 becomes higher than that in the natural state.

When the force Fz2 is applied to the pressure receiving surface 211, the base member 21 tensilely deforms in the Z-axis direction and the pitch of the inter-digital electrode 22 becomes longer than that in the natural state. Accordingly, the frequency f of the surface acoustic wave excited in the force detection sensor 2 becomes lower than that in the natural state.

Therefore, the force sensor 1 may detect the forces Fz1, Fz2 based on the changes (amounts of change and directions of change) of the frequency f from the natural state.

When the force Fx1 is applied to the pressure receiving surface 211, the base member 21 shear-deforms toward the positive side in the X-axis direction and the pitch of the inter-digital electrode 22 becomes shorter than that in the natural state. Accordingly, the frequency f of the surface acoustic wave excited in the force detection sensor 2 becomes higher than that in the natural state.

When the force Fx2 is applied to the pressure receiving surface 211, the base member 21 shear-deforms toward the negative side in the X-axis direction and the pitch of the inter-digital electrode 22 becomes longer than that in the natural state. Accordingly, the frequency f of the surface acoustic wave excited in the force detection sensor 2 becomes lower than that in the natural state.

Therefore, the force sensor 1 may detect the forces Fx1, Fx2 based on the changes (amounts of change and directions of change) of the frequency f from the natural state.

Note that, as described above, in the force sensor 1, the force Fz and the force Fx may be detected, however, both are detected by the changes in frequency f. For determination as to whether the applied force is the force Fz or force Fx, a device (circuit or the like) for the determination is necessary and the whole apparatus may be complicated.

Accordingly, it is preferable to use the force sensor 1 in environments in which only one of the force Fz in the Z-axis direction and the force Fx in the X-axis direction is substantially applied. Thereby, the force Fz or force Fx may be accurately detected. In a different point of view, the force sensor 1 is excellent in convenience because the sensor may be used as both the force sensor that detects the force Fz in the Z-axis direction and the force sensor that detects the force Fx in the X-axis direction.

As above, the force sensor 1 of the embodiment is explained. The force sensor 1 has the force detection sensor 2. Accordingly, the sensor may enjoy the advantages of the above described force detection sensor 2 and exert the excellent reliability and detection property.

Second Embodiment

Figure 4:
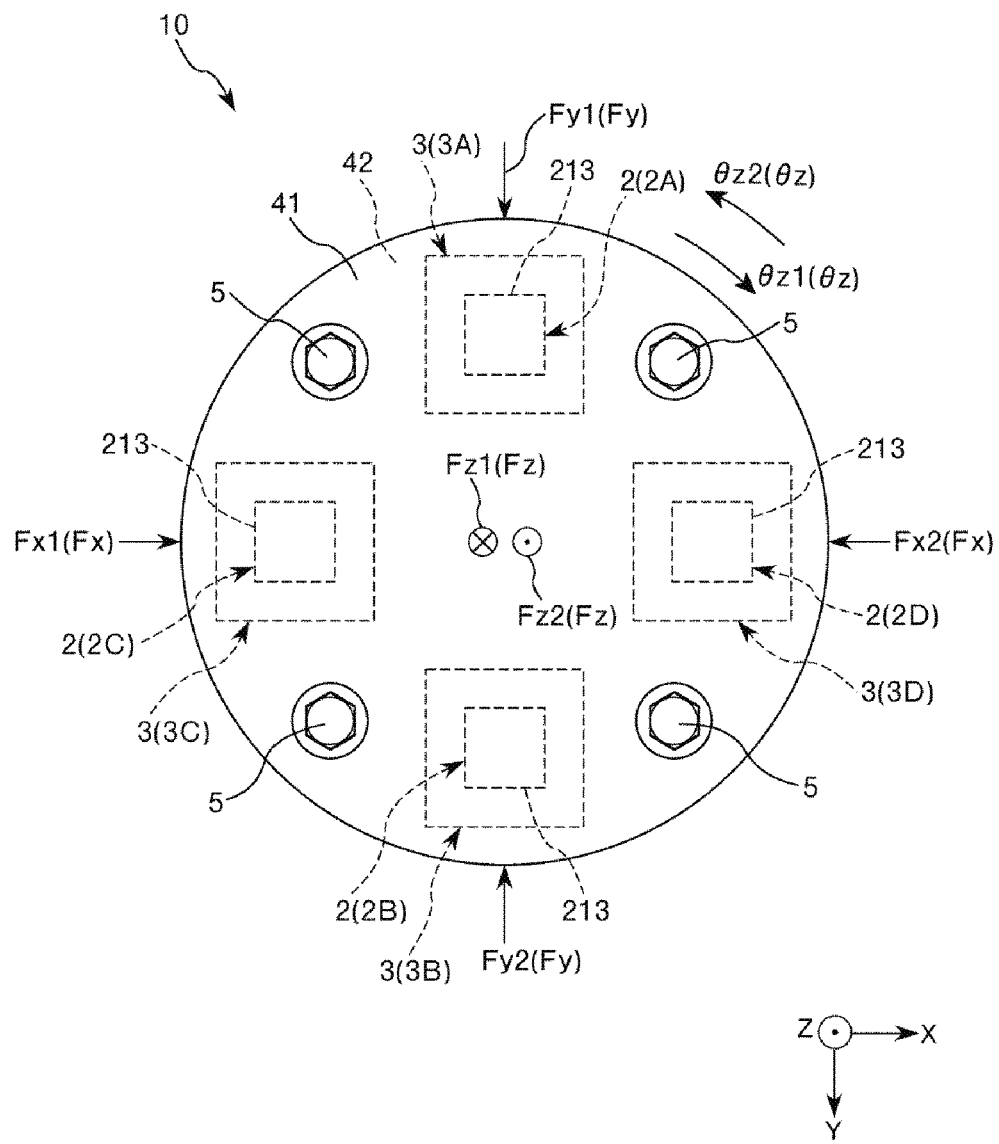
FIG. 4 is a plan view showing a torque sensor according to a second embodiment of the invention.
Figure 5:
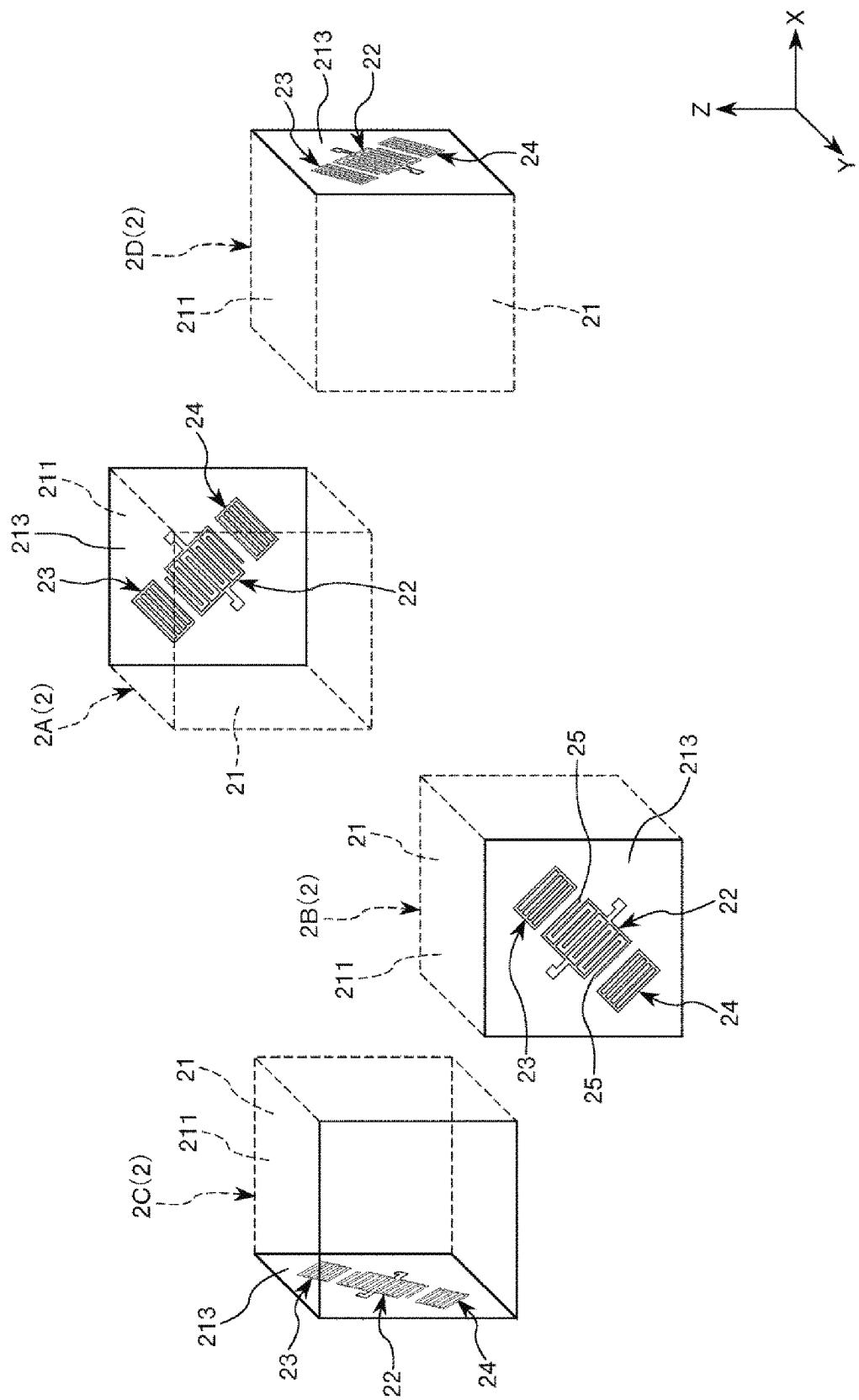
FIG. 5 is a perspective view of a force detection sensor of the torque sensor shown in FIG. 4.

FIG. 4 is a plan view showing a torque sensor according to the second embodiment of the invention. FIG. 5 is a perspective view of a force detection sensor of the torque sensor shown in FIG. 4.

A torque sensor 10 according to the embodiment is the same as the above described force sensor 1 of the first embodiment mainly except that the number and the placement of the force detection sensors 2 are different.

Note that, in the following explanation, the torque sensor 10 of the second embodiment will be described with a focus on the differences from the above described force sensor 1 of the first embodiment and the description of the same items will be omitted. Further, in FIGS. 4 and 5, the same configurations as those of the above described embodiment have the same signs. Furthermore, in FIG. 5, the bonding wires BW connected to the respective electrodes 221, 222 are not shown.

The torque sensor 10 shown in FIG. 4 may detect a force Fz (Fz1, Fz2) in the Z-axis directions, a force Fx (Fx1, Fx2) in the X-axis directions, a force Fy (Fy1, Fy2) in the Y-axis directions, and torque θz (θz1, θz2) about the Z-axis.

The torque sensor 10 has four packages 3 (3A, 3B, 3C, 3D) housing force detection sensors 2 (2A, 2B, 2C, 2D). Further, the packages 3A, 3B, 3C, 3D are arranged at equal intervals (intervals of 90°) along the outer circumference parts of the substrates 41, 42. The packages 3A, 3B are placed side by side along the Y-axis and the packages 3C, 3D are placed side by side along the X-axis. Note that the configurations of the respective force detection sensors 2 (2A, 2B, 2C, 2D) are the same as those of the above described first embodiment.

Placement surfaces 213 for the force detection sensors 2A, 2B housed in the packages 3A, 3B are placed with the normal lines along the Y-axis, and placement surfaces 213 for the force detection sensors 2C, 2D housed in the packages 3C, 3D are placed with the normal lines along the X-axis. Note that four projecting portions 422 (not shown) of the substrate 42 are provided in correspondence with the respective packages 3A, 3B, 3C, 3D.

As shown in FIG. 5, regarding the force detection sensors 2A, 2B, the directions of tilt of the inter-digital electrodes 22 with respect to the Z-axis are opposite to each other in a plan view as seen from one side in the Y-axis direction. Specifically, in the plan view as seen from the positive side in the Y-axis direction, the inter-digital electrode 22 tilts counterclockwise with respect to the Z-axis in the force detection sensor 2A and the inter-digital electrode 22 tilts clockwise with respect to the Z-axis in the force detection sensor 2B. Thereby, when the force Fx is applied to the pressure receiving surfaces 211, the pitch of the inter-digital electrode 22 of one of the force detection sensors 2A, 2B becomes longer than that in the natural state and the pitch of the inter-digital electrode 22 of the other becomes shorter than that in the natural state.

Further, as shown in FIG. 5, regarding the force detection sensors 2C, 2D, the directions of tilt of the inter-digital electrodes 22 with respect to the Z-axis are opposite to each other in a plan view as seen from one side in the Y-axis direction. Specifically, in the plan view as seen from the positive side in the X-axis direction, the inter-digital electrode 22 tilts clockwise with respect to the Z-axis in the force detection sensor 2C and the inter-digital electrode 22 tilts counterclockwise with respect to the Z-axis in the force detection sensor 2D. Thereby, when the force Fy is applied to the pressure receiving surfaces 211, the pitch of the inter-digital electrode 22 of one of the force detection sensors 2C, 2D becomes longer than that in the natural state and the pitch of the inter-digital electrode 22 of the other becomes shorter than that in the natural state.

As above, the configuration of the torque sensor 10 is explained. The torque sensor 10 may detect the force Fz (Fz1, Fz2) in the Z-axis directions, the force Fx (Fx1, Fx2) in the X-axis directions, and the force Fy (Fy1, Fy2) in the Y-axis directions, and may further detect torque θz (θz1, θz2) about the Z-axis. As below, a force detection method of the torque sensor 10 will be explained. Note that, hereinafter, a state in which another external force than pressurization is not substantially applied to the force detection sensors 2 is also referred to as "natural state". Further, hereinafter, the forces Fz, Fx, Fy, θz act on the pressure receiving surfaces 211 via the substrate 41 with the substrate 42 fixed.

When the force Fz1 is applied to the pressure receiving surfaces 211, the base members 21 of the respective force detection sensors 2A, 2B, 2C, 2D compressively deform in the Z-axis direction. Thereby, the pitches of the inter-digital electrodes 22 of the respective force detection sensors 2A, 2B, 2C, 2D become shorter than those in the natural state. Accordingly, frequencies fa, fb, fc, fd of the surface acoustic wave excited in the respective force detection sensors 2A, 2B, 2C, 2D become higher than those in the natural state.

When the force Fz2 is applied to the pressure receiving surfaces 211, the base members 21 of the respective force detection sensors 2A, 2B, 2C, 2D tensilely deform in the Z-axis direction. Thereby, the pitches of the inter-digital electrodes 22 of the respective force detection sensors 2A, 2B, 2C, 2D become longer than those in the natural state. Accordingly, the frequencies fa, fb, fc, fd of the surface acoustic wave excited in the respective force detection sensors 2A, 2B, 2C, 2D become lower than those in the natural state.

Therefore, the torque sensor 10 may detect the forces Fz1, Fz2 based on the changes (amounts of change and directions of change) of the frequencies fa, fb, fc, fd from the natural state.

When the force Fx1 is applied to the pressure receiving surfaces 211, the base members 21 of the respective force detection sensors 2A, 2B, 2C, 2D shear-deform toward the positive side in the X-axis direction. Thereby, the pitch of the inter-digital electrode 22 of the force detection sensor 2A becomes shorter than that in the natural state and, on the other hand, the pitch of the inter-digital electrode 22 of the force detection sensor 2B becomes longer than that in the natural state. Accordingly, the frequency fa of the surface acoustic wave excited in the force detection sensor 2A becomes higher than that in the natural state, and the frequency fb of the surface acoustic wave excited in the force detection sensor 2B becomes lower than that in the natural state.

When the force Fx2 is applied to the pressure receiving surfaces 211, the base members 21 of the respective force detection sensors 2A, 2B, 2C, 2D shear-deform toward the negative side in the X-axis direction. Thereby, the pitch of the inter-digital electrode 22 of the force detection sensor 2A becomes longer than that in the natural state and, on the other hand, the pitch of the inter-digital electrode 22 of the force detection sensor 2B becomes shorter than that in the natural state. Accordingly, the frequency fa of the surface acoustic wave excited in the force detection sensor 2A becomes lower than that in the natural state, and the frequency fb of the surface acoustic wave excited in the force detection sensor 2B becomes higher than that in the natural state.

Therefore, the torque sensor 10 may detect the forces Fx1, Fx2 based on the changes (amounts of change and directions of change) of the frequencies fa, fb from the natural state. Note that, in the force detection sensors 2C, 2D, the placement surfaces 213 are orthogonal to the directions of the forces Fx1, Fx2. Accordingly, even when the pressure receiving surfaces 211 are subjected to the forces Fx1, Fx2 and the base members 21 deform, the pitches of the inter-digital electrodes 22 do not substantially change (if the pitches change, the pitch changes are sufficiently smaller than the pitch changes of the force detection sensors 2A, 2B).

When the force Fy1 is applied to the pressure receiving surfaces 211, the base members 21 of the respective force detection sensors 2A, 2B, 2C, 2D shear-deform toward the positive side in the Y-axis direction. Thereby, the pitch of the inter-digital electrode 22 of the force detection sensor 2C becomes shorter than that in the natural state and, on the other hand, the pitch of the inter-digital electrode 22 of the force detection sensor 2D becomes longer than that in the natural state. Accordingly, the frequency fc of the surface acoustic wave excited in the force detection sensor 2C becomes higher than that in the natural state, and the frequency fd of the surface acoustic wave excited in the force detection sensor 2D becomes lower than that in the natural state.

When the force Fy2 is applied to the pressure receiving surfaces 211, the base members 21 of the respective force detection sensors 2A, 2B, 2C, 2D shear-deform toward the negative side in the Y-axis direction. Thereby, the pitch of the inter-digital electrode 22 of the force detection sensor 2C becomes longer than that in the natural state and, on the other hand, the pitch of the inter-digital electrode 22 of the force detection sensor 2D becomes shorter than that in the natural state. Accordingly, the frequency fc of the surface acoustic wave excited in the force detection sensor 2C becomes lower than that in the natural state, and the frequency fd of the surface acoustic wave excited in the force detection sensor 2D becomes higher than that in the natural state.

Therefore, the torque sensor 10 may detect the forces Fy1, Fy2 based on the changes (amounts of change and directions of change) of the frequencies fc, fd from the natural state.

Note that, in the force detection sensors 2A, 2B, the placement surfaces 213 are orthogonal to the directions of the forces Fy1, Fy2. Accordingly, even when the pressure receiving surfaces 211 are subjected to the forces Fy1, Fy2 and the base members 21 deform, the pitches of the inter-digital electrodes 22 do not substantially change (if the pitches change, the pitch changes are sufficiently smaller than the pitch changes of the force detection sensors 2C, 2D).

When the torque θz1 is applied to the pressure receiving surfaces 211, the base members 21 of the respective force detection sensors 2A, 2B, 2C, 2D torsionally deform in the forward direction about the Z-axis (in the clockwise direction as seen from the positive side of the Z-axis). Thereby, the pitches of the inter-digital electrodes 22 of the force detection sensors 2A, 2B become shorter than those in the natural state and, on the other hand, the pitches of the inter-digital electrodes 22 of the force detection sensor 2C, 2D become longer than those in the natural state. Accordingly, the frequencies fa, fb of the surface acoustic wave excited in the force detection sensors 2A, 2B become higher than those in the natural state, and the frequencies fc, fd of the surface acoustic wave excited in the force detection sensors 2C, 2D become lower than those in the natural state.

When the torque θz2 is applied to the pressure receiving surfaces 211, the base members 21 of the respective force detection sensors 2A, 2B, 2C, 2D torsionally deform in the backward direction about the Z-axis (in the counterclockwise direction as seen from the positive side of the Z-axis). Thereby, the pitches of the inter-digital electrodes 22 of the force detection sensors 2A, 2B become longer than those in the natural state and, on the other hand, the pitches of the inter-digital electrodes 22 of the force detection sensor 2C, 2D become shorter than those in the natural state. Accordingly, the frequencies fa, fb of the surface acoustic wave excited in the force detection sensors 2A, 2B become lower than those in the natural state, and the frequencies fc, fd of the surface acoustic wave excited in the force detection sensors 2C, 2D become higher than those in the natural state.

Therefore, the torque sensor 10 may detect the torque θz1, θz2 based on the changes (amounts of change and directions of change) of the frequencies fa, fb, fc, fd from the natural state.

As above, the force detection method of the torque sensor 10 is explained. Particularly, in the embodiment, which of the forces Fz1, Fz2, Fx1, Fx2, Fy1, Fy2 and torque θz1, θz2 is the force applied to the torque sensor 10 may be easily specified. Specifically, as shown in the following table 1, combinations of the change directions of the frequencies fa, fb, fc, fd (whether the frequencies are higher or lower than those in the natural state) differ with respect to each of the forces Fz1, Fz2, Fx1, Fx2, Fy1, Fy2 and torque θz1, θz2. Accordingly, which (or a resultant force of at least two) of the forces Fz1, Fz2, Fx1, Fx2, Fy1, Fy2 and torque θz1, θz2 is the applied force may be easily specified using the differences.

Note that "Higher" in Table 1 means that the frequency is higher than that in the natural state, "Lower" means that the frequency is lower than that in the natural state, and "—" means that the frequency does not substantially change from the natural state (the same applies to the following tables 2, 3, 4, 5).

TABLE 1

| | Frequency | | | |
|---|---|---|---|---|
| | Fa | fb | fc | fd |
| Fx1 | Higher | Lower | — | — |
| Fx2 | Lower | Higher | — | — |
| Fy1 | — | — | Higher | Lower |
| Fy2 | — | — | Lower | Higher |
| Fz1 | Higher | Higher | Higher | Higher |
| Fz2 | Lower | Lower | Lower | Lower |
| θz1 | Higher | Higher | Lower | Lower |
| θz2 | Lower | Lower | Higher | Higher |

As above, the torque sensor 10 of the embodiment is explained. The torque sensor 10 has the force detection sensors 2. Accordingly, the sensor may enjoy the above described advantages of the force detection sensors 2 and exert excellent reliability and detection property.

Note that the torque sensor 10 of the embodiment may detect the forces Fz, Fx, Fy in addition to the torque θz, i.e., is a composite sensor serving as a force sensor and a torque sensor. However, the torque sensor 10 is not limited to that, but may not have the function as a force sensor. In the embodiment, the torque sensor may detect θz as a rotation force about the Z-axis, however, may be adapted to further detect a rotation force about the X-axis and a rotation force about the Y-axis by calculation of the frequency changes of the respective force detection sensors 2A, 2B, 2C, 2D as appropriate, for example.

Further, in the embodiment, the torque sensor 10 has the four force detection sensors 2, however, the number of force detection sensors 2 is not particularly limited, but may be e.g. two, three, five or more.

Third Embodiment

Figure 6:
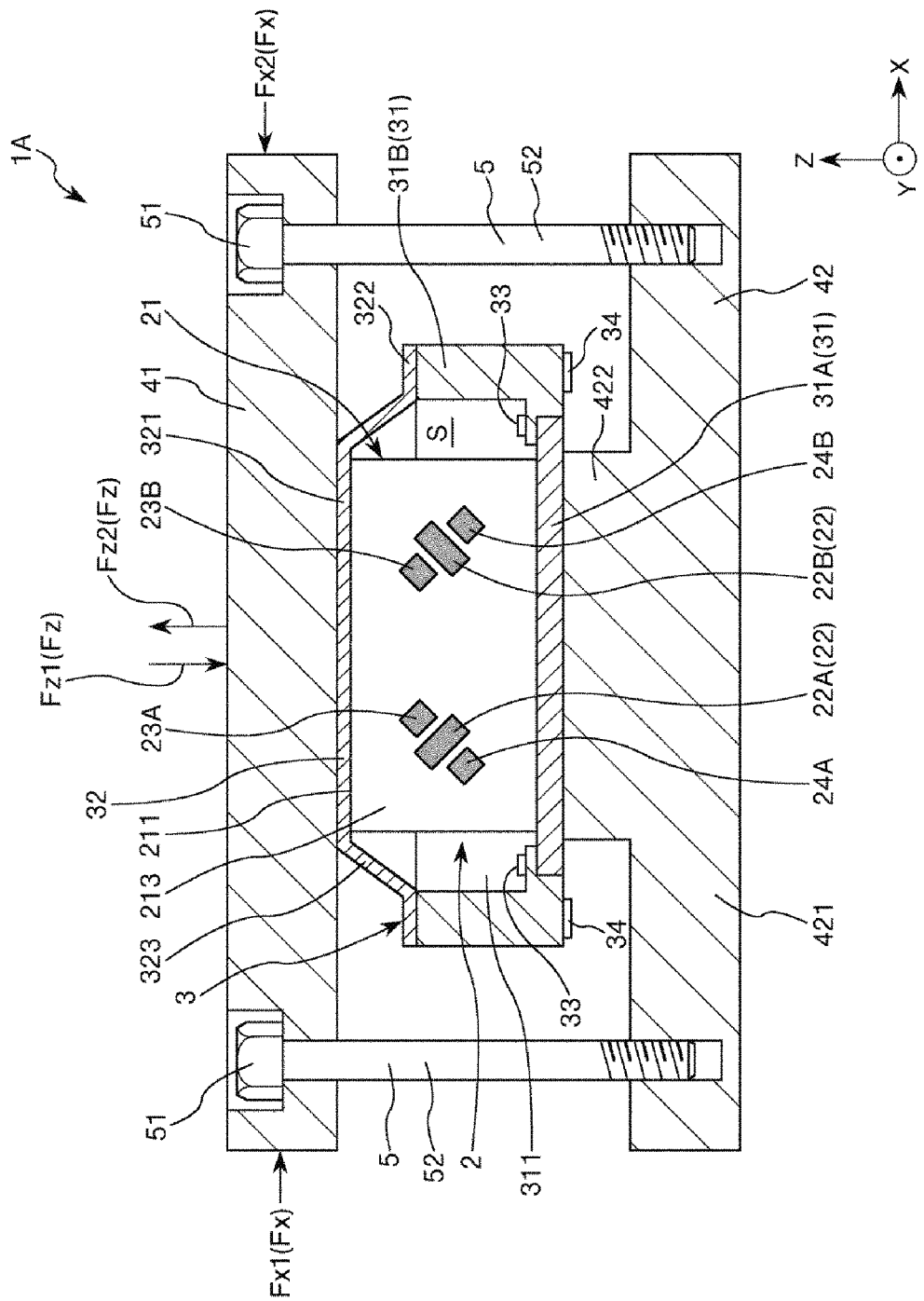
FIG. 6 is a sectional view showing a force sensor according to a third embodiment of the invention.
Figure 7:
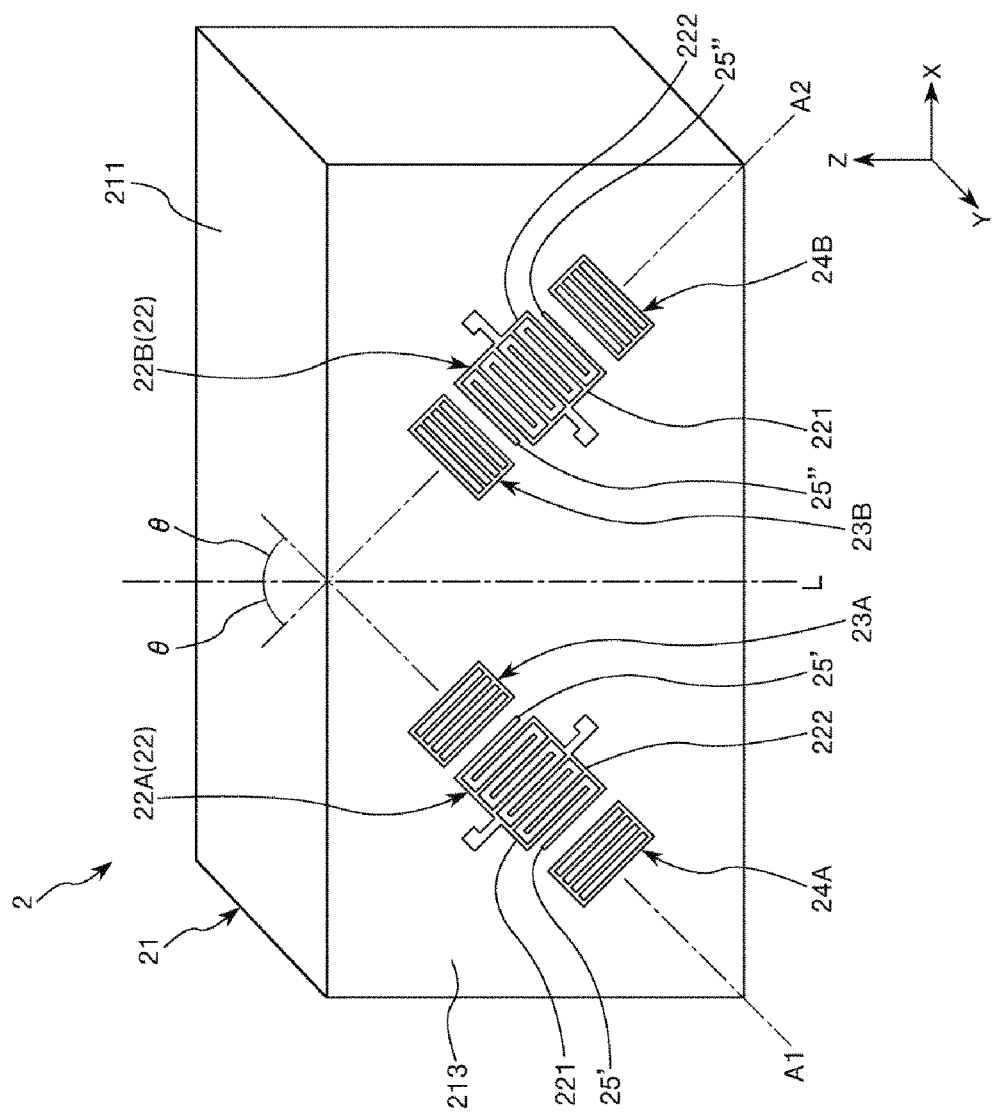
FIG. 7 is a perspective view of a force detection sensor of the force sensor shown in FIG. 6.

FIG. 6 is a sectional view showing a force sensor according to the third embodiment of the invention. FIG. 7 is a perspective view of a force detection sensor of the force sensor shown in FIG. 6.

A force sensor 1A according to the embodiment is the same as the above described force sensor 1 of the first embodiment mainly except that the configuration of the force detection sensor is different.

Note that, in the following explanation, the force sensor 1A of the third embodiment will be described with a focus on the differences from the above described force sensor 1 of the first embodiment and the description of the same items will be omitted. Further, in FIGS. 6 and 7, the same configurations as those of the above described embodiments have the same signs. Furthermore, in FIGS. 6 and 7, the bonding wires BW connected to the respective electrodes 221, 222 are not shown.

As shown in FIGS. 6 and 7, in the force detection sensor 2 of the force sensor 1A, a plurality of inter-digital electrodes 22 are placed on the placement surface 213. Specifically, the sensor has first electrode fingers 25' (first inter-digital electrode 22A) in an arrangement direction tilted toward one side with respect to the normal line (Z-axis) of the pressure receiving surface 211 and second electrode fingers 25" (second inter-digital electrode 22B) in an arrangement direction tilted toward the other side with respect to the normal line (Z-axis) of the pressure receiving surface 211 in the plan view of the placement surface 213. In other words, the sensor has the first inter-digital electrode 22A tilted toward one side with respect to the normal line (Z-axis) of the pressure receiving surface 211 and the second inter-digital electrode 22B tilted toward the other side with respect to the normal line (Z-axis) of the pressure receiving surface 211 in the plan view of the placement surface 213. Accordingly, it is considered that the force detection sensor 2 contains a plurality of SAW resonators. According to the configuration, both Fz and Fx may be detected by a simple configuration as will be described later. That is, the force sensor 1 (force detection sensor 2) having more detection axes is obtained.

Note that the number of inter-digital electrodes 22 placed on the placement surface 213 is not particularly limited as long as the number is more than one. In the embodiment, the number is two. Thereby, the number of inter-digital electrodes 22 is smaller and the area of the placement surface 213 may be made smaller by the size of the electrodes. Accordingly, the force detection sensor 2 may be downsized.

The first inter-digital electrode 22A and the second inter-digital electrode 22B are placed side by side in the X-axis direction. The first inter-digital electrode 22A is provided with a tilt clockwise in the drawing with respect to the Z-axis, and the second inter-digital electrode 22B is provided with a tilt counterclockwise in the drawing with respect to the Z-axis. Accordingly, the first inter-digital electrode 22A and the second inter-digital electrode 22B are placed in a tapered arrangement such that the separation distance between the electrodes gradually decreases (gradually increases) along the Z-axis direction. The first inter-digital electrode 22A and the second inter-digital electrode 22B are provided line-symmetrically with respect to a virtual line L located between the electrodes and parallel to the Z-axis.

Supposing that the axis along the direction in which the electrode fingers 25 of the first inter-digital electrode 22A are arranged is an axis A1 and the axis along the direction in which the electrode fingers 25 of the second inter-digital electrode 22B are arranged is an axis A2 in the plan view of the placement surface 213, tilt angles θ of the axes A1, A2 with respect to the Z-axis are not particularly limited, but preferably from 10° to 80°, more preferably from 30° to 60°, and even more preferably from 40° to 50°. The angles are set as above, and thereby, when any one of the forces Fz, Fx is applied, the pitches of the first and second inter-digital electrodes 22A, 22B may be changed more largely. Therefore, the forces Fz, Fx may be respectively detected with higher sensitivity.

A pair of reflectors 23A, 24A are provided on both sides with the first inter-digital electrode 22A in between, and a pair of reflectors 23B, 24B are provided on both sides with the second inter-digital electrode 22B in between.

As above, the configuration of the force sensor 1A is explained. The force sensor 1A may detect the force Fz (Fz1, Fz2) in the Z-axis directions and the force Fx (Fx1, Fx2) in the X-axis directions. As below, a force detection method of the force sensor 1A will be explained. Note that, hereinafter, a state in which another external force than pressurization is not substantially applied to the force detection sensor 2 is also referred to as "natural state". Further, hereinafter, the forces Fz, Fx, Fy, θz act on the pressure receiving surface 211 via the substrate 41 with the substrate 42 fixed.

When the force Fz1 is applied to the pressure receiving surface 211, the base member 21 compressively deforms in the Z-axis direction. Thereby, both of the pitches of the first and second inter-digital electrodes 22A, 22B become shorter than those in the natural state. Accordingly, both of frequencies f1, f2 of surface acoustic wave excited in the first and second inter-digital electrodes 22A, 22B become higher than those in the natural state.

When the force Fz2 is applied to the pressure receiving surface 211, the base member 21 tensilely deforms in the Z-axis direction. Thereby, both of the pitches of the first and second inter-digital electrodes 22A, 22B become longer than those in the natural state. Accordingly, both of frequencies f1, f2 of surface acoustic wave excited in the first and second inter-digital electrodes 22A, 22B become lower than those in the natural state.

Therefore, the force sensor 1A may detect the forces Fz1, Fz2 based on the changes (amounts of change and directions of change) of the frequencies f1, f2 from the natural state.

When the force Fx1 is applied to the pressure receiving surface 211, the base member 21 shear-deforms toward the positive side in the X-axis direction. Thereby, the pitch of the first inter-digital electrode 22A becomes longer than that in the natural state and, on the other hand, the pitch of the second inter-digital electrode 22B becomes shorter than that in the natural state. Accordingly, the frequency f1 of the surface acoustic wave excited in the first inter-digital electrode 22A becomes lower than that in the natural state, and the frequency f2 of the surface acoustic wave excited in the second inter-digital electrode 22B becomes higher than that in the natural state.

When the force Fx2 is applied to the pressure receiving surface 211, the base member 21 shear-deforms toward the negative side in the X-axis direction. Thereby, the pitch of the first inter-digital electrode 22A becomes shorter than that in the natural state and, on the other hand, the pitch of the second inter-digital electrode 22 becomes longer than that in the natural state. Accordingly, the frequency f1 of the surface acoustic wave excited in the first inter-digital electrode 22A becomes higher than that in the natural state, and the frequency f2 of the surface acoustic wave excited in the second inter-digital electrode 22B becomes lower than that in the natural state.

Therefore, the force sensor 1A may detect the forces Fx1, Fx2 based on the changes (amounts of change and directions of change) of the frequencies f1, f2 from the natural state.

As above, the force detection method of the force sensor 1A is explained. Particularly, in the embodiment, which of the forces Fz1, Fz2, Fx1, Fx2 is the force applied to the force sensor 1A may be easily specified. Specifically, as shown in the following table 2, combinations of the change directions of the frequencies f1, f2 (whether the frequencies are higher or lower than those in the natural state) differ with respect to each of the forces Fz1, Fz2, Fx1, Fx2. Accordingly, which (or a resultant force of at least two) of the forces Fz1, Fz2, Fx1, Fx2 is the applied force may be easily specified using the differences.

TABLE 2

| | Frequency | |
| --- | --- | --- |
| | f1 | f2 |
| Fx1 | Lower | Higher |
| Fx2 | Higher | Lower |
| Fz1 | Higher | Higher |
| Fz2 | Lower | Lower |

As above, the force sensor 1A of the embodiment is explained. The force sensor 1A has the force detection sensor 2. Accordingly, the sensor may enjoy the above described advantages of the force detection sensor 2 and exert excellent reliability and detection property.

Fourth Embodiment

Figure 8:
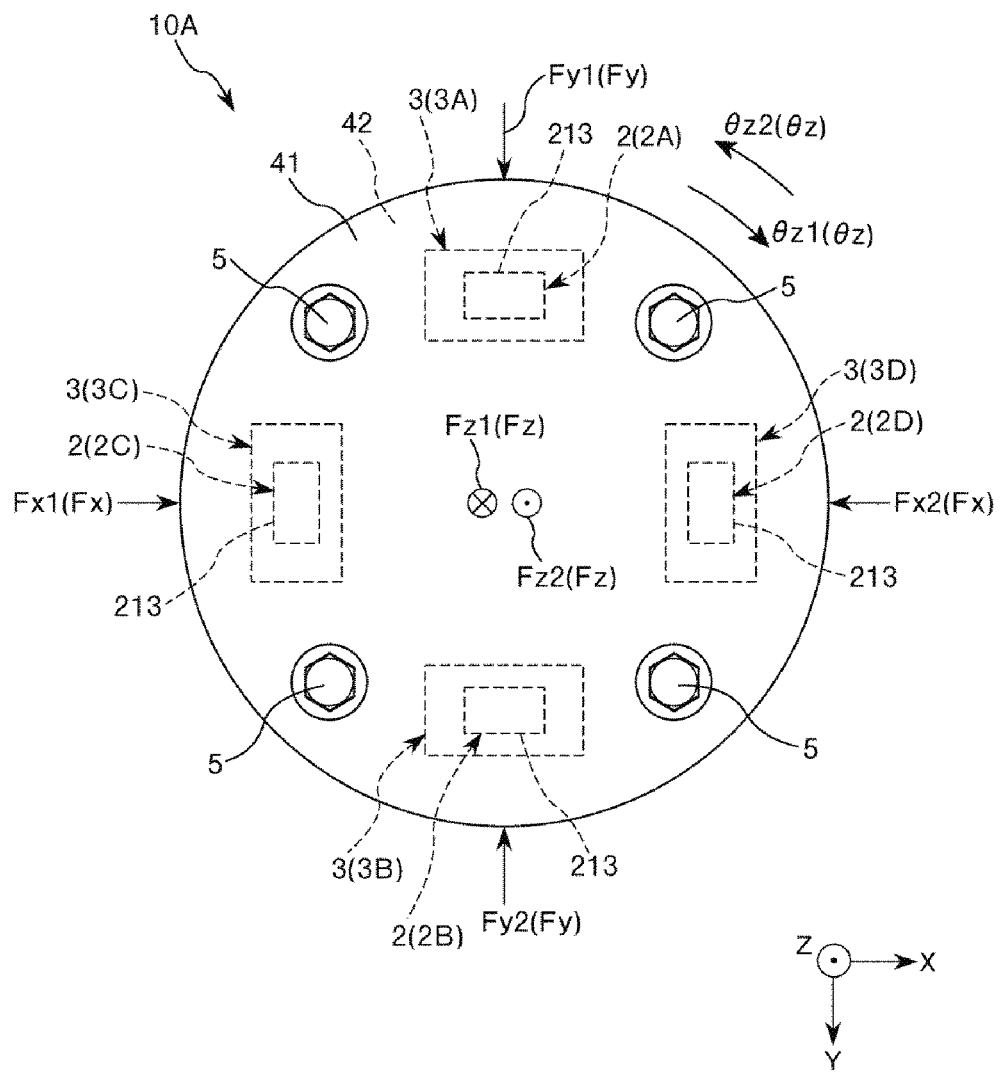
FIG. 8 is a plan view showing a torque sensor according to a fourth embodiment of the invention.
Figure 9:
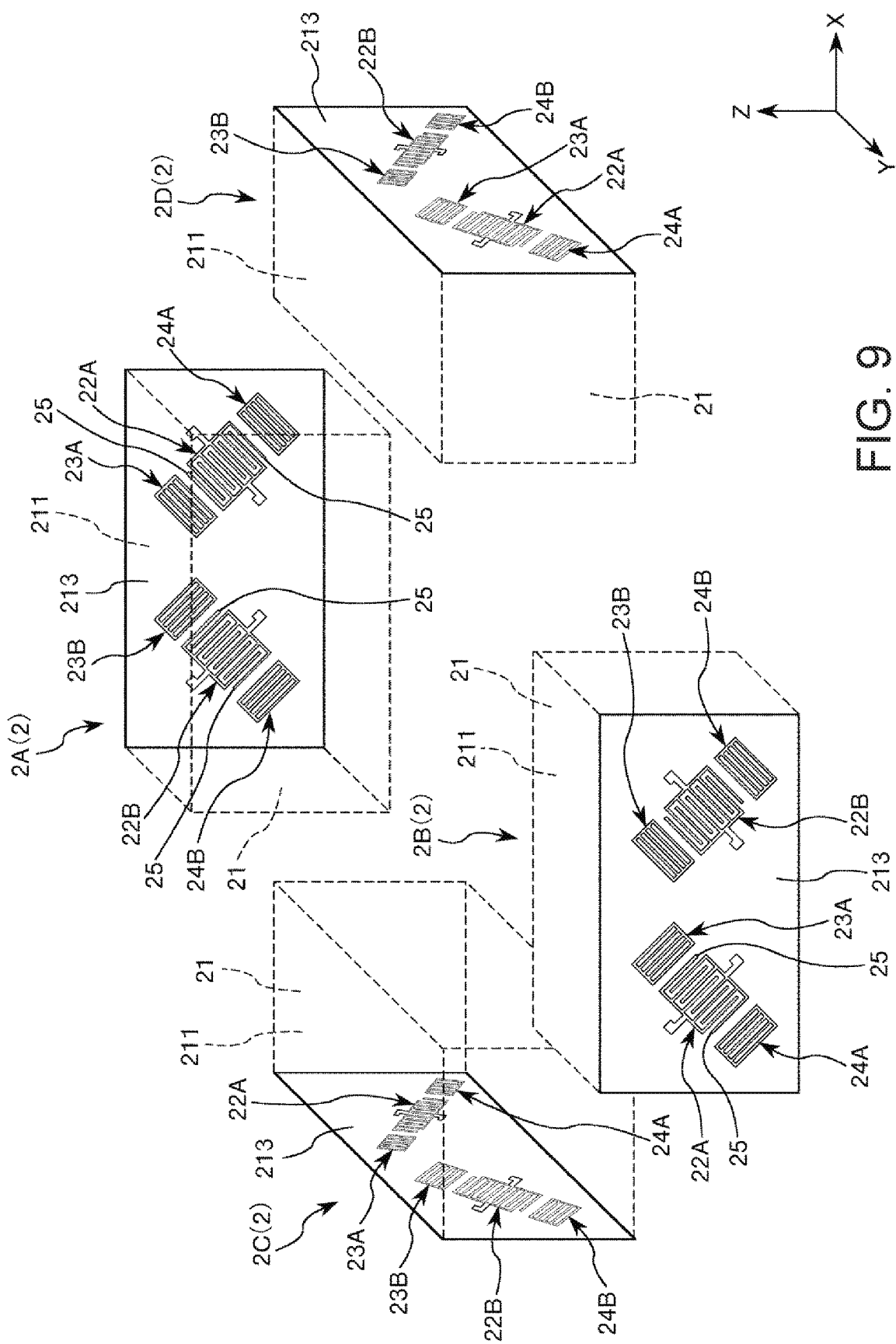
FIG. 9 is a perspective view of a force detection sensor of the torque sensor shown in FIG. 8.

FIG. 8 is a plan view showing a torque sensor according to the fourth embodiment of the invention. FIG. 9 is a perspective view of a force detection sensor of the torque sensor shown in FIG. 8.

A torque sensor 10A according to the embodiment is the same as the above described force sensor 1A of the third embodiment mainly except that the number and the placement of the force detection sensors 2 are different.

Note that, in the following explanation, the torque sensor 10A of the fourth embodiment will be described with a focus on the differences from the above described force sensor 1A of the third embodiment and the description of the same items will be omitted. Further, in FIGS. 8 and 9, the same configurations as those of the above described embodiments have the same signs. Furthermore, in FIG. 9, the bonding wires BW connected to the respective electrodes 221, 222 are not shown.

The torque sensor 10A shown in FIG. 8 may detect a force Fz (Fz1, Fz2) in the Z-axis directions, a force Fx (Fx1, Fx2) in the X-axis directions, a force Fy (Fy1, Fy2) in the Y-axis directions, and torque θz (θz1, θz2) about the Z-axis.

As shown in FIG. 8, the torque sensor 10A has four packages 3 (3A, 3B, 3C, 3D) housing force detection sensors 2 (2A, 2B, 2C, 2D). Further, the packages 3A, 3B, 3C, 3D are arranged at equal intervals (intervals of 90°) along the outer circumference parts of the substrates 41, 42. The packages 3A, 3B are placed side by side along the Y-axis and the packages 3C, 3D are placed side by side along the X-axis. Note that the configurations of the respective force detection sensors 2 (2A, 2B, 2C, 2D) are the same as those of the above described third embodiment.

As shown in FIG. 9, placement surfaces 213 for the force detection sensors 2A, 2B are placed with normal lines along the Y-axis, and placement surfaces 213 for the force detection sensors 2C, 2D are placed with normal lines along the X-axis.

Note that four projecting portions 422 (not shown) of the substrate 42 are provided in correspondence with the respective packages 3A, 3B, 3C, 3D.

As above, the configuration of the torque sensor 10A is explained. The torque sensor 10A may detect the force Fz (Fz1, Fz2) in the Z-axis directions, the force Fx (Fx1, Fx2) in the X-axis directions, and the force Fy (Fy1, Fy2) in the Y-axis directions, and may detect further torque θz (θz1, θz2) about the Z-axis. As below, a force detection method of the torque sensor 10A will be explained. Note that, hereinafter, a state in which another external force than pressurization is not substantially applied to the force detection sensors 2 is also referred to as "natural state". Further, hereinafter, the forces Fz, Fx, Fy, θz act on the pressure receiving surfaces 211 via the substrate 41 with the substrate 42 fixed.

When the force Fz1 is applied to the pressure receiving surfaces 211, the base members 21 of the respective force detection sensors 2A, 2B, 2C, 2D compressively deform in the Z-axis direction. Thereby, the pitches of the first and second inter-digital electrodes 22A, 22B of the respective force detection sensors 2A, 2B, 2C, 2D become shorter than those in the natural state. Accordingly, both the frequencies f1 of the surface acoustic wave excited by the first inter-digital electrodes 22A and the frequencies f2 of the surface acoustic wave excited by the second inter-digital electrodes 22B in the respective force detection sensors 2A, 2B, 2C, 2D become higher than those in the natural state.

When the force Fz2 is applied to the pressure receiving surfaces 211, the base members 21 of the respective force detection sensors 2A, 2B, 2C, 2D tensilely deform in the Z-axis direction. Thereby, the pitches of the first and second inter-digital electrodes 22A, 22B of the respective force detection sensors 2A, 2B, 2C, 2D become longer than those in the natural state. Accordingly, both of the frequencies f1, f2 of the respective force detection sensors 2A, 2B, 2C, 2D become lower than those in the natural state.

Therefore, the torque sensor 10A may detect the forces Fz1, Fz2 based on the changes (amounts of change and directions of change) of the frequencies f1, f2 of the respective force detection sensors 2A, 2B, 2C, 2D from the natural state.

When the force Fx1 is applied to the pressure receiving surfaces 211, the base members 21 of the respective force detection sensors 2A, 2B, 2C, 2D shear-deform toward the positive side in the X-axis direction. Thereby, the pitch of the first inter-digital electrode 22A of the force detection sensor 2A and the pitch of the second inter-digital electrode 22B of the force detection sensor 2B become shorter than those in the natural state and, on the other hand, the pitches of the second inter-digital electrode 22B of the force detection sensor 2A and the first inter-digital electrode 22A of the force detection sensor 2B become longer than those in the natural state. Accordingly, the frequency f1 of the force detection sensor 2A and the frequency f2 of the force detection sensor 2B become higher than those in the natural state, and the frequency f2 of the force detection sensor 2A and the frequency f1 of the force detection sensor 2B become lower than those in the natural state.

When the force Fx2 is applied to the pressure receiving surfaces 211, the base members 21 of the respective force detection sensors 2A, 2B, 2C, 2D shear-deform toward the negative side in the X-axis direction. Thereby, the pitch of the second inter-digital electrode 22B of the force detection sensor 2A and the pitch of the first inter-digital electrode 22A of the force detection sensor 2B become shorter than those in the natural state and, on the other hand, the pitches of the first inter-digital electrode 22A of the force detection sensor 2A and the second inter-digital electrode 22B of the force detection sensor 2B become longer than those in the natural state. Accordingly, the frequency f2 of the force detection sensor 2A and the frequency f1 of the force detection sensor 2B become higher than those in the natural state, and the frequency f1 of the force detection sensor 2A and the frequency f2 of the force detection sensor 2B become lower than those in the natural state.

Therefore, the torque sensor 10A may detect the forces Fx1, Fx2 based on the changes (amounts of change and directions of change) of the frequencies f1, f2 of the force detection sensors 2A, 2B from the natural state. Note that, in the force detection sensors 2C, 2D, the placement surfaces 213 are orthogonal to the directions of the forces Fx1, Fx2. Accordingly, even when the pressure receiving surfaces 211 are subjected to the forces Fx1, Fx2 and the base members 21 deform, the pitches of the first and second inter-digital electrodes 22A, 22B do not substantially change (if the pitches change, the pitch changes are sufficiently smaller than the pitch changes of the force detection sensors 2A, 2B).

When the force Fy1 is applied to the pressure receiving surfaces 211, the base members 21 of the respective force detection sensors 2A, 2B, 2C, 2D shear-deform toward the positive side in the Y-axis direction. Thereby, the pitch of the first inter-digital electrode 22A of the force detection sensor 2C and the pitch of the second inter-digital electrode 22B of the force detection sensor 2D become shorter than those in the natural state and, on the other hand, the pitches of the second inter-digital electrode 22B of the force detection sensor 2C and the first inter-digital electrode 22A of the force detection sensor 2D become longer than those in the natural state. Accordingly, the frequency f1 of the force detection sensor 2C and the frequency f2 of the force detection sensor 2D become higher than those in the natural state, and the frequency f2 of the force detection sensor 2C and the frequency f1 of the force detection sensor 2D become lower than those in the natural state.

When the force Fy2 is applied to the pressure receiving surfaces 211, the base members 21 of the respective force detection sensors 2A, 2B, 2C, 2D shear-deform toward the negative side in the Y-axis direction. Thereby, the pitch of the second inter-digital electrode 22B of the force detection sensor 2C and the pitch of the first inter-digital electrode 22A of the force detection sensor 2D become shorter than those in the natural state and, on the other hand, the pitches of the first inter-digital electrode 22A of the force detection sensor 2C and the second inter-digital electrode 22B of the force detection sensor 2D become longer than those in the natural state. Accordingly, the frequency f2 of the force detection sensor 2C and the frequency f1 of the force detection sensor 2D become higher than those in the natural state, and the frequency f1 of the force detection sensor 2C and the frequency f2 of the force detection sensor 2D become lower than those in the natural state.

Therefore, the torque sensor 10A may detect the forces Fy1, Fy2 based on the changes (amounts of change and directions of change) of the frequencies f1, f2 of the force detection sensors 2C, 2D from the natural state. Note that, in the force detection sensors 2A, 2B, the placement surfaces 213 are orthogonal to the directions of the forces Fy1, Fy2. Accordingly, even when the pressure receiving surfaces 211 are subjected to the forces Fy1, Fy2 and the base members 21 deform, the pitches of the first and second inter-digital electrodes 22A, 22B do not substantially change (if the pitches change, the pitch changes are sufficiently smaller than the pitch changes of the force detection sensors 2C, 2D).

When the torque θz1 is applied to the pressure receiving surfaces 211, the base members 21 of the respective force detection sensors 2A, 2B, 2C, 2D torsionally deform in the forward direction about the Z-axis (in the clockwise direction as seen from the positive side of the Z-axis). Thereby, the pitches of the first inter-digital electrodes 22A of the force detection sensors 2A, 2B, 2C, 2D become shorter than those in the natural state and, on the other hand, the pitches of the second inter-digital electrodes 22B of the force detection sensor 2A, 2B, 2C, 2D become longer than those in the natural state. Accordingly, the frequencies f1 of the respective force detection sensors 2A, 2B, 2C, 2D become higher than those in the natural state, and the frequencies f2 of the respective force detection sensors 2A, 2B, 2C, 2D become lower than those in the natural state.

When the torque θz2 is applied to the pressure receiving surfaces 211, the base members 21 of the respective force detection sensors 2A, 2B, 2C, 2D torsionally deform in the backward direction about the Z-axis (in the counterclockwise direction as seen from the positive side of the Z-axis). Thereby, the pitches of the first inter-digital electrodes 22A of the force detection sensors 2A, 2B, 2C, 2D become longer than those in the natural state and, on the other hand, the pitches of the second inter-digital electrodes 22B of the force detection sensor 2A, 2B, 2C, 2D become shorter than those in the natural state. Accordingly, the frequencies f1 of the respective force detection sensors 2A, 2B, 2C, 2D become lower than those in the natural state, and the frequencies f2 of the respective force detection sensors 2A, 2B, 2C, 2D become higher than those in the natural state.

Therefore, the torque sensor 10A may detect the torque θz1, θz2 based on the changes (amounts of change and directions of change) of the frequencies f1, f2 of the respective force detection sensors 2A, 2B, 2C, 2D from the natural state.

As above, the force detection method of the torque sensor 10A is explained. Particularly, in the embodiment, which of the forces Fz1, Fz2, Fx1, Fx2, Fy1, Fy2 and torque θz1, θz2 is the force applied to the torque sensor 10A may be easily specified. Specifically, as shown in the following table 3, combinations of the change directions of the frequencies f1, f2 of the respective force detection sensors 2A, 2B, 2C, 2D (whether the frequencies are higher or lower than those in the natural state) differ with respect to each of the forces Fz1, Fz2, Fx1, Fx2, Fy1, Fy2 and torque θz1, θz2. Accordingly, which (or a resultant force of at least two) of the forces Fz1, Fz2, Fx1, Fx2, Fy1, Fy2 and torque θz1, θz2 is the applied force may be easily specified using the differences.

TABLE 3

| | Frequency | | | | | | | |
|---|---|---|---|---|---|---|---|---|
| | Force detection sensor 2A | | Force detection sensor 2B | | Force detection sensor 2C | | Force detection sensor 2D | |
| | f1 | f2 | f1 | f2 | f1 | f2 | f1 | f2 |
| Fx1 | Higher | Lower | Lower | Higher | — | — | — | — |
| Fx2 | Lower | Higher | Higher | Lower | — | — | — | — |
| Fy1 | — | — | — | — | Higher | Lower | Lower | Higher |
| Fy2 | — | — | — | — | Lower | Higher | Higher | Lower |
| Fz1 | Higher | Higher | Higher | Higher | Higher | Higher | Higher | Higher |
| Fz2 | Lower | Lower | Lower | Lower | Lower | Lower | Lower | Lower |
| θz1 | Higher | Lower | Higher | Lower | Higher | Lower | Higher | Lower |
| θz2 | Lower | Higher | Lower | Higher | Lower | Higher | Lower | Higher |

As above, the torque sensor 10A of the embodiment is explained. The torque sensor 10A has the force detection sensors 2. Accordingly, the sensor may enjoy the above described advantages of the force detection sensors 2 and exert excellent reliability and detection property.

Note that the torque sensor 10A of the embodiment may detect the forces Fz, Fx, Fy in addition to the torque θz, i.e., is a composite sensor serving as a force sensor and a torque sensor. However, the torque sensor 10A is not limited to that, but may not have the function as a force sensor. In the embodiment, the torque sensor may detect θz as a rotation force about the Z-axis, however, may be adapted to further detect a rotation force about the X-axis and a rotation force about the Y-axis by calculation of the frequency changes of the respective force detection sensors 2A, 2B, 2C, 2D as appropriate, for example.

Further, in the embodiment, the torque sensor 10A has the four force detection sensors 2, however, the number of force detection sensors 2 is not particularly limited, but may be e.g. two, three, five or more.

Fifth Embodiment

Figure 10:
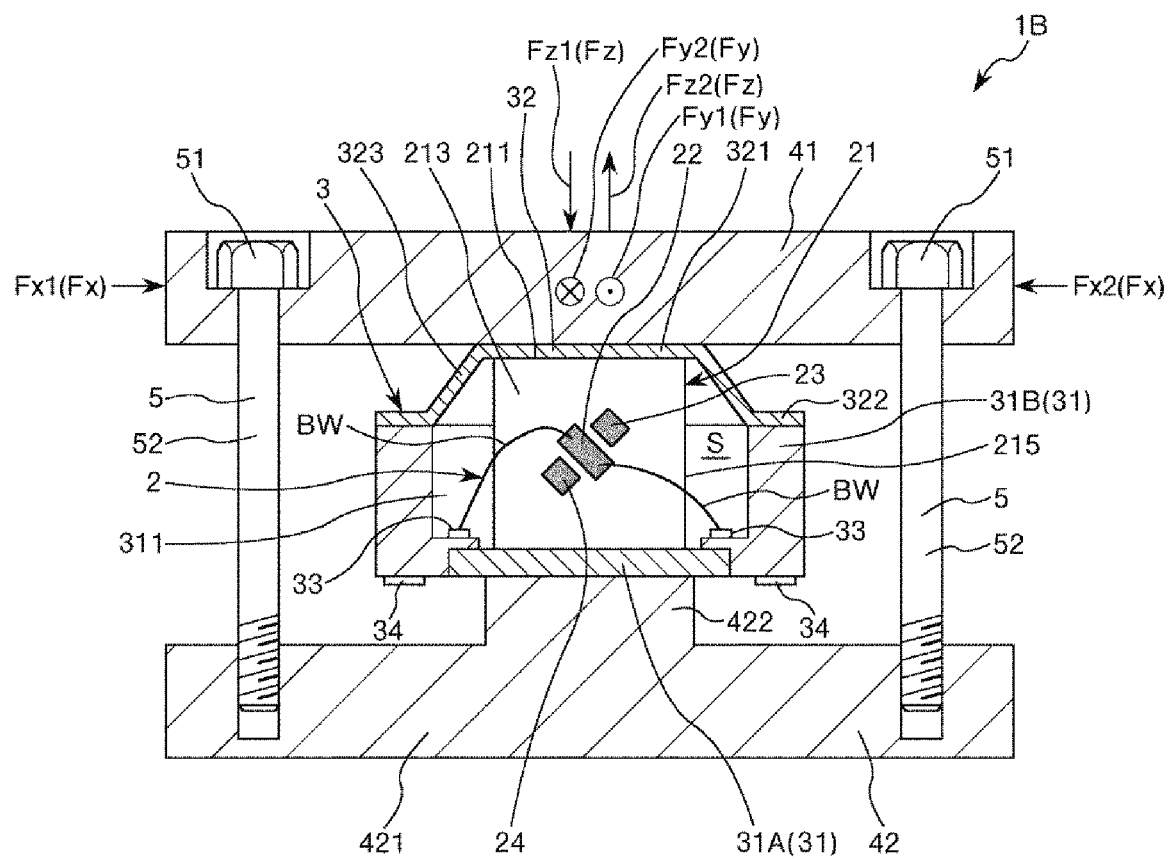
FIG. 10 is a sectional view showing a force sensor according to a fifth embodiment of the invention.
Figure 11:
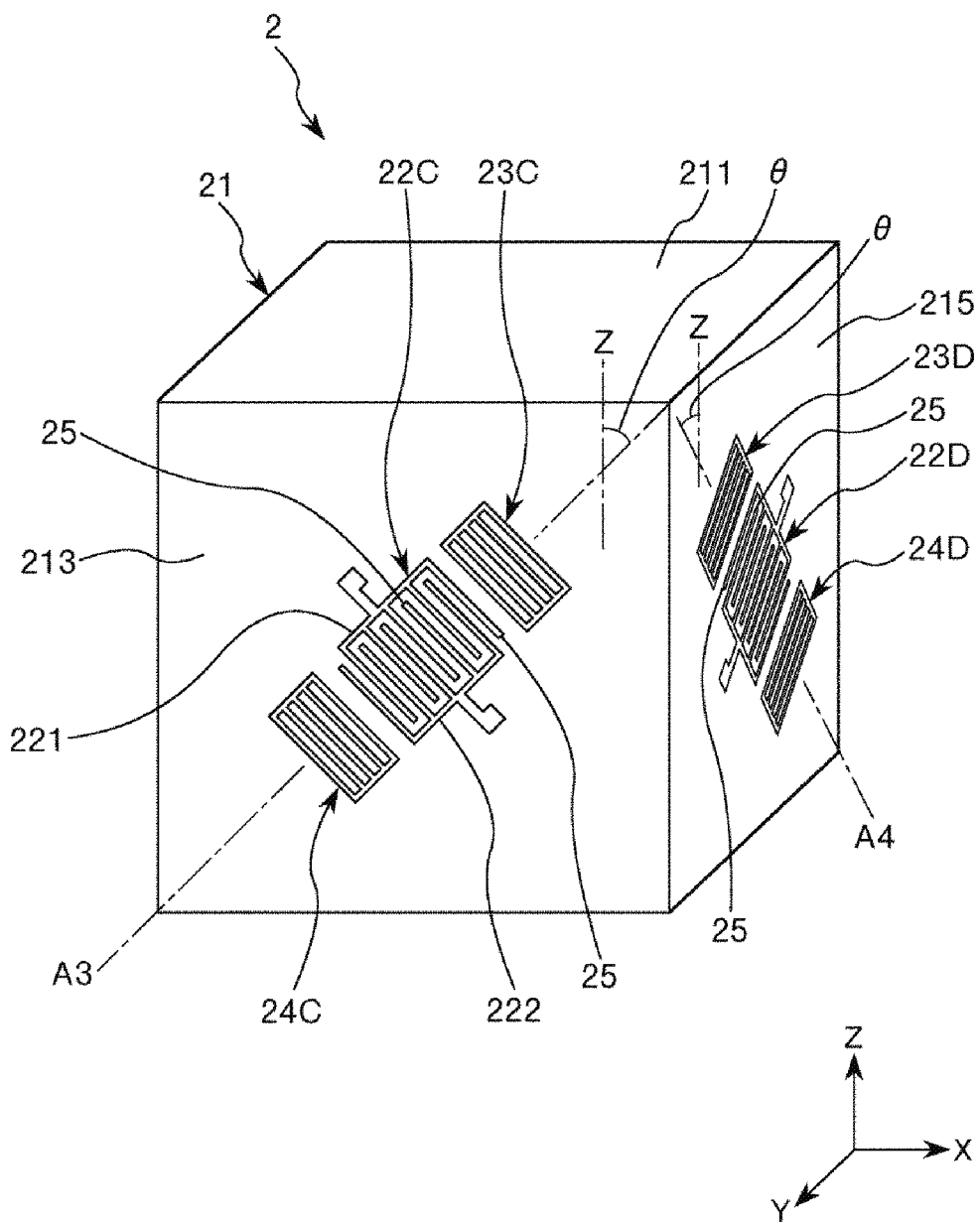
FIG. 11 is a perspective view of a force detection sensor of the force sensor shown in FIG. 10.

FIG. 10 is a sectional view showing a force sensor according to the fifth embodiment of the invention. FIG. 11 is a perspective view of a force detection sensor of the force sensor shown in FIG. 10.

A force sensor 1B according to the embodiment is the same as the above described force sensor 1 of the first embodiment mainly except that the configuration of the force detection sensor is different.

Note that, in the following explanation, the force sensor 1B of the fifth embodiment will be described with a focus on the differences from the above described force sensor 1 of the first embodiment and the description of the same items will be omitted. Further, in FIGS. 10 and 11, the same configurations as those of the above described embodiments have the same signs. Furthermore, in FIG. 11, the bonding wires BW connected to the respective electrodes 221, 222 are not shown.

As shown in FIG. 10, in the force detection sensor 2 of the force sensor 1B, the base member 21 has a placement surface 215 as a third surface having a different normal direction from the pressure receiving surface 211 (first surface) and the placement surface 213 (second surface). The placement surface 215 is formed by a side surface of the base member 21 and the orientation of the normal line is different from that of the placement surface 213. Specifically, the placement surface 213 is formed by an XZ-plane with the normal line along the Y-axis and the placement surface 215 is formed by a YZ-plane with the normal line along the X-axis. Note that the placement of the placement surface 215 is not particularly limited as long as the orientation is different from that of the placement surface 213.

As shown in FIG. 11, the force detection sensor 2 has electrode fingers 25 (inter-digital electrode 22C) placed on the placement surface 213 and electrode fingers 25 (inter-digital electrode 22D) placed on the placement surface 215. Further, in the plan view of the placement surface 213, the arrangement direction of the electrode fingers 25 of the inter-digital electrode 22C placed on the placement surface 213 is different from the normal direction (Z-axis direction) of the pressure receiving surface 211, and, in the plan view of the placement surface 215, the arrangement direction of the electrode fingers 25 of the inter-digital electrode 22D placed on the placement surface 215 is different from the normal direction (Z-axis direction) of the pressure receiving surface 211. That is, both the inter-digital electrode 22C and the inter-digital electrode 22D tilt with respect to the normal line of the pressure receiving surface 211. Specifically, in the plan view of the placement surface 213, the inter-digital electrode 22C tilts clockwise with respect to the Z-axis, and, in the plan view of the placement surface 215, the inter-digital electrode 22D tilts counterclockwise with respect to the Z-axis. Note that the directions of tilt of the inter-digital electrode 22C, 22D are not particularly limited.

According to the configuration, as will be described later, the force Fy in the Y-axis direction may be detected in addition to the force Fz in the Z-axis direction and the force Fx in the X-axis direction. Accordingly, the force sensor 1 (force detection sensor 2) having more detection axes is obtained.

In the plan view of the placement surface 213, supposing that the axis along the direction in which the electrode fingers 25 of the inter-digital electrode 22C are arranged is an axis A3, a tilt angle θ of the axis A3 with respect to the Z-axis is not particularly limited, but preferably from 30° to 60° and more preferably from 40° to 50°, for example. Thereby, when any one of the force Fz and force Fx is applied, the pitch of the inter-digital electrode 22C may be changed more reliably.

Further, in the plan view of the placement surface 215, supposing that the axis along the direction in which the electrode fingers 25 of the inter-digital electrode 22D are arranged is an axis A4, a tilt angle θ of the axis A4 with respect to the Z-axis is not particularly limited, but preferably from 30° to 60° and more preferably from 40° to 50°, for example. Thereby, when any one of the force Fz and force Fx is applied, the pitch of the inter-digital electrode 22D may be changed more reliably.

A pair of reflectors 23C, 24C are provided on both sides with the inter-digital electrode 22C in between, and a pair of reflectors 23D, 24D are provided on both sides with the inter-digital electrode 22D in between.

As is the case of the above described embodiments, the base member 21 is formed by a piezoelectric material (quartz crystal). Accordingly, the placement surfaces 213, 215 respectively include surfaces of the piezoelectric material. Thereby, surface acoustic wave may be excited in the placement surfaces 213, 215 more reliably.

As above, the configuration of the force sensor 1B is explained. The force sensor 1B may detect the force Fz (Fz1, Fz2) in the Z-axis directions, the force Fx (Fx1, Fx2) in the X-axis directions, and the force Fy (Fy1, Fy2) in the Y-axis directions. As below, a force detection method of the force sensor 1B will be explained. Note that, hereinafter, a state in which another external force than pressurization is not substantially applied to the force detection sensor 2 is also referred to as "natural state". Further, hereinafter, the forces Fz, Fx, Fy, θz act on the pressure receiving surface 211 via the substrate 41 with the substrate 42 fixed.

When the force Fz1 is applied to the pressure receiving surface 211, the base member 21 compressively deforms in the Z-axis direction. Thereby, both of the pitches of the inter-digital electrodes 22C, 22D become shorter than those in the natural state. Accordingly, both of frequencies f3, f4 of surface acoustic wave excited in the inter-digital electrodes 22C, 22D become higher than those in the natural state.

When the force Fz2 is applied to the pressure receiving surface 211, the base member 21 tensilely deforms in the Z-axis direction. Thereby, both of the pitches of the inter-digital electrodes 22C, 22D become longer than those in the natural state. Accordingly, both of frequencies f3, f4 of surface acoustic wave excited in the inter-digital electrodes 22C, 22D become lower than those in the natural state.

Therefore, the force sensor 1B may detect the forces Fz1, Fz2 based on the changes (amounts of change and directions of change) of the frequencies f3, f4 from the natural state.

When the force Fx1 is applied to the pressure receiving surface 211, the base member 21 shear-deforms toward the positive side in the X-axis direction. Thereby, the pitch of the inter-digital electrode 22C becomes longer than that in the natural state. Accordingly, the frequency f3 of the surface acoustic wave excited in the inter-digital electrode 22C becomes lower than that in the natural state.

When the force Fx2 is applied to the pressure receiving surface 211, the base member 21 shear-deforms toward the negative side in the X-axis direction. Thereby, the pitch of the inter-digital electrode 22C becomes shorter than that in the natural state. Accordingly, the frequency f3 of the surface acoustic wave excited in the inter-digital electrode 22C becomes higher than that in the natural state.

Therefore, the force sensor 1B may detect the forces Fx1, Fx2 based on the changes (amounts of change and directions of change) of the frequency f3 from the natural state. Note that the placement surface 215 is orthogonal to the directions of the forces Fx1, Fx2. Accordingly, even when the pressure receiving surface 211 is subjected to the forces Fx1, Fx2 and the base member 21 deforms, the pitch of the inter-digital electrode 22D does not substantially change (if the pitch changes, the pitch change is sufficiently smaller than the pitch change of the inter-digital electrode 22C). Therefore, even when the forces Fx1, Fx2 are applied, the frequency f4 of the surface acoustic wave excited in the inter-digital electrode 22D changes little from the natural state.

When the force Fy1 is applied to the pressure receiving surface 211, the base member 21 shear-deforms toward the positive side in the Y-axis direction. Thereby, the pitch of the inter-digital electrode 22D becomes longer than that in the natural state. Accordingly, the frequency f4 of the surface acoustic wave excited in the inter-digital electrode 22D becomes lower than that in the natural state.

When the force Fy2 is applied to the pressure receiving surface 211, the base member 21 shear-deforms toward the negative side in the Y-axis direction. Thereby, the pitch of the inter-digital electrode 22D becomes shorter than that in the natural state. Accordingly, the frequency f4 of the surface acoustic wave excited in the inter-digital electrode 22D becomes higher than that in the natural state.

Therefore, the force sensor 1B may detect the forces Fy1, Fy2 based on the changes (amounts of change and directions of change) of the frequency f4 from the natural state. Note that the placement surface 213 is orthogonal to the directions of the forces Fy1, Fy2. Accordingly, even when the pressure receiving surface 211 is subjected to the forces Fy1, Fy2 and the base member 21 deforms, the pitch of the inter-digital electrode 22C does not substantially change (if the pitch changes, the pitch change is sufficiently smaller than the pitch change of the inter-digital electrode 22D). Therefore, even when the forces Fx1, Fx2 are applied, the frequency f3 of the surface acoustic wave excited in the inter-digital electrode 22C changes little from the natural state.

As above, the force detection method of the force sensor 1B is explained. Particularly, in the embodiment, which of the forces Fz1, Fz2, Fx1, Fx2, Fy1, Fy2 is the force applied to the force sensor 1B may be easily specified. Specifically, as shown in the following table 4, combinations of the change directions of the frequencies f3, f4 (whether the frequencies are higher or lower than those in the natural state) differ with respect to each of the forces Fz1, Fz2, Fx1, Fx2, Fy1, Fy2. Accordingly, which (or a resultant force of at least two) of the forces Fz1, Fz2, Fx1, Fx2, Fy1, Fy2 is the applied force may be easily specified using the differences.

TABLE 4

| | Frequency | |
| --- | --- | --- |
| | f3 | f4 |
| Fx1 | Lower | — |
| Fx2 | Higher | — |

TABLE 4-continued

| | Frequency | |
| --- | --- | --- |
| | f3 | f4 |
| Fy1 | — | Lower |
| Fy2 | — | Higher |
| Fz1 | Higher | Higher |
| Fz2 | Lower | Lower |

As above, the force sensor 1B of the embodiment is explained. The force sensor 1B has the force detection sensor 2. Accordingly, the sensor may enjoy the above described advantages of the force detection sensor 2 and exert excellent reliability and detection property.

Sixth Embodiment

Figure 12:
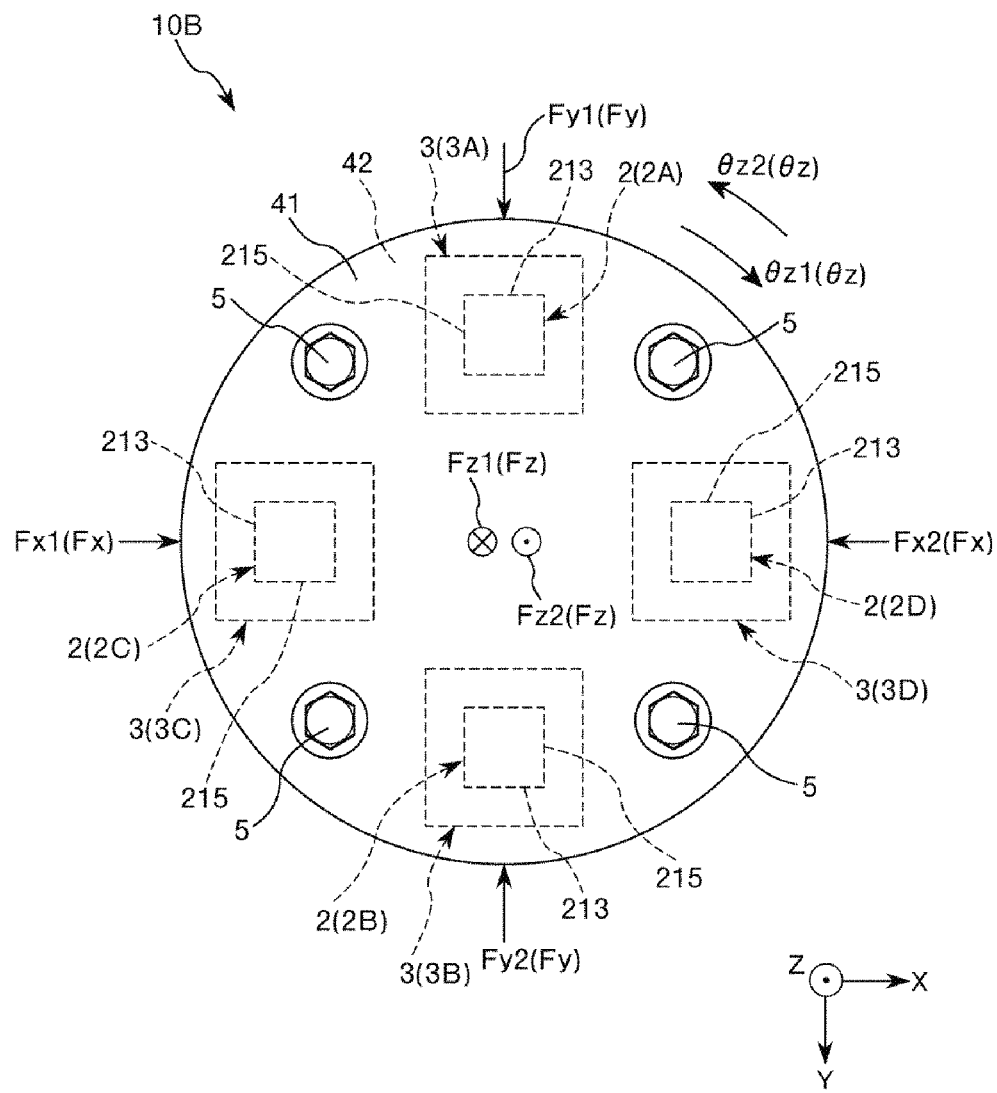
FIG. 12 is a plan view showing a torque sensor according to a sixth embodiment of the invention.
Figure 13:
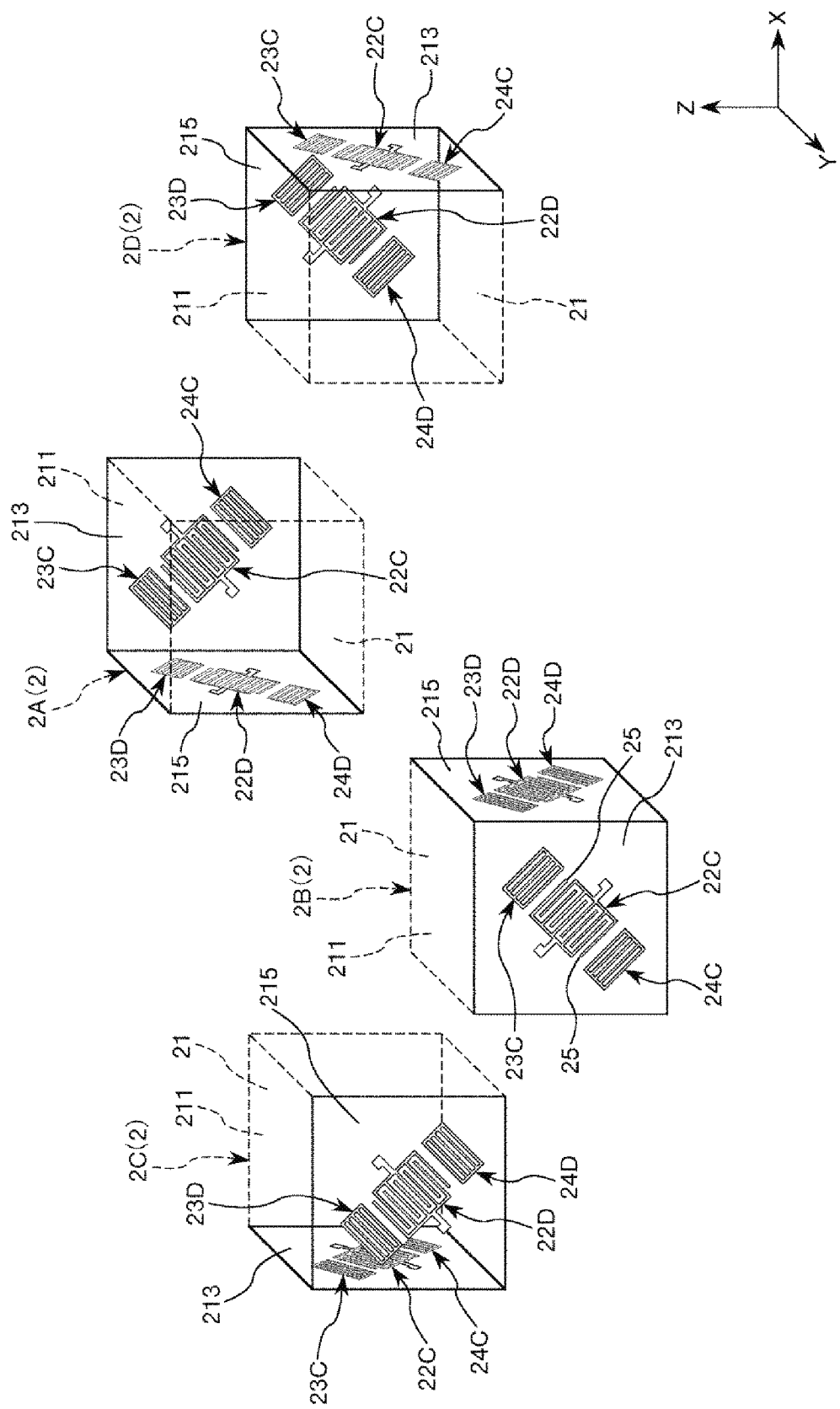
FIG. 13 is a perspective view of a force detection sensor of the torque sensor shown in FIG. 12.

FIG. 12 is a plan view showing a torque sensor according to the sixth embodiment of the invention. FIG. 13 is a perspective view of a force detection sensor of the torque sensor shown in FIG. 12.

A torque sensor 10B according to the embodiment is the same as the above described force sensor 1B of the fifth embodiment mainly except that the number and the placement of the force detection sensors 2 are different.

Note that, in the following explanation, the torque sensor 10B of the sixth embodiment will be described with a focus on the differences from the above described force sensor 1B of the fifth embodiment and the description of the same items will be omitted. Further, in FIGS. 12 and 13, the same configurations as those of the above described embodiments have the same signs. Furthermore, in FIG. 13, the bonding wires BW connected to the respective electrodes 221, 222 are not shown.

The torque sensor 10B shown in FIG. 12 may detect a force Fz (Fz1, Fz2) in the Z-axis directions, a force Fx (Fx1, Fx2) in the X-axis directions, a force Fy (Fy1, Fy2) in the Y-axis directions, and torque θz (θz1, θz2) about the Z-axis.

As shown in FIG. 12, the torque sensor 10B has four packages 3 (3A, 3B, 3C, 3D) housing force detection sensors 2 (2A, 2B, 2C, 2D). Further, the packages 3A, 3B, 3C, 3D are arranged at equal intervals (intervals of 90°) along the outer circumference parts of the substrates 41, 42. The packages 3A, 3B are placed side by side along the Y-axis and the packages 3C, 3D are placed side by side along the X-axis. Note that the configurations of the respective force detection sensors 2 (2A, 2B, 2C, 2D) are the same as those of the above described fifth embodiment.

As shown in FIGS. 12 and 13, in the force detection sensors 2A, 2B, placement surfaces 213 are XZ-planes with normal lines along the Y-axis, and placement surfaces 215 are YZ-planes with normal lines along the X-axis. On the other hand, in the force detection sensors 2C, 2D, placement surfaces 213 are YZ-planes with normal lines along the X-axis, and placement surfaces 215 are XZ-planes with normal lines along the Y-axis.

Note that four projecting portions 422 (not shown) of the substrate 42 are provided in correspondence with the respective packages 3A, 3B, 3C, 3D.

As above, the configuration of the torque sensor 10B is explained. The torque sensor 10B may detect the force Fz (Fz1, Fz2) in the Z-axis directions, the force Fx (Fx1, Fx2) in the X-axis directions, and the force Fy (Fy1, Fy2) in the Y-axis directions, and may further detect torque θz (θz1, θz2) about the Z-axis. As below, a force detection method of the torque sensor 10B will be explained. Note that, hereinafter, a state in which another external force than pressurization is not substantially applied to the force detection sensors 2 is also referred to as "natural state". Further, hereinafter, the forces Fz, Fx, Fy, θz act on the pressure receiving surfaces 211 via the substrate 41 with the substrate 42 fixed.

When the force Fz1 is applied to the pressure receiving surfaces 211, the base members 21 of the respective force detection sensors 2A, 2B, 2C, 2D compressively deform in the Z-axis direction. Thereby, the pitches of the inter-digital electrodes 22C, 22D of the respective force detection sensors 2A, 2B, 2C, 2D become shorter than those in the natural state. Accordingly, both the frequencies f3 of the surface acoustic wave excited by the inter-digital electrodes 22C and the frequencies f4 of the surface acoustic wave excited by the inter-digital electrodes 22D in the respective force detection sensors 2A, 2B, 2C, 2D become higher than those in the natural state.

When the force Fz2 is applied to the pressure receiving surfaces 211, the base members 21 of the respective force detection sensors 2A, 2B, 2C, 2D tensilely deform in the Z-axis direction. Thereby, the pitches of the inter-digital electrodes 22C, 22D of the respective force detection sensors 2A, 2B, 2C, 2D become longer than those in the natural state. Accordingly, the frequencies f3, f4 of the respective force detection sensors 2A, 2B, 2C, 2D become lower than those in the natural state.

Therefore, the torque sensor 10B may detect the forces Fz1, Fz2 based on the changes (amounts of change and directions of change) of the frequencies f3, f4 of the respective force detection sensors 2A, 2B, 2C, 2D from the natural state.

When the force Fx1 is applied to the pressure receiving surfaces 211, the base members 21 of the respective force detection sensors 2A, 2B, 2C, 2D shear-deform toward the positive side in the X-axis direction. Thereby, the pitches of the inter-digital electrode 22C of the force detection sensor 2A and the inter-digital electrode 22D of the force detection sensor 2C become shorter than those in the natural state and the pitches of the inter-digital electrode 22C of the force detection sensor 2B and the inter-digital electrode 22D of the force detection sensor 2D become longer than those in the natural state. Accordingly, the frequency f3 of the force detection sensor 2A and the frequency f4 of the force detection sensor 2C become higher than those in the natural state, and the frequency f3 of the force detection sensor 2B and the frequency f4 of the force detection sensor 2D become lower than those in the natural state.

When the force Fx2 is applied to the pressure receiving surfaces 211, the base members 21 of the respective force detection sensors 2A, 2B, 2C, 2D shear-deform toward the negative side in the X-axis direction. Thereby, the pitches of the inter-digital electrode 22C of the force detection sensor 2A and the inter-digital electrode 22D of the force detection sensor 2C become longer than those in the natural state and the pitches of the inter-digital electrode 22C of the force detection sensor 2B and the inter-digital electrode 22D of the force detection sensor 2D become shorter than those in the natural state. Accordingly, the frequency f3 of the force detection sensor 2A and the frequency f4 of the force detection sensor 2C become lower than those in the natural state, and the frequency f3 of the force detection sensor 2B and the frequency f4 of the force detection sensor 2D become higher than those in the natural state.

Therefore, the torque sensor 10B may detect the forces Fx1, Fx2 based on the changes (amounts of change and directions of change) of the frequencies f3, f4 of the force detection sensors 2A, 2B, 2C, 2D from the natural state. Note that, in the force detection sensors 2A, 2B, the placement surfaces 215 are orthogonal to the directions of the forces Fx1, Fx2. Accordingly, even when the pressure receiving surfaces 211 are subjected to the forces Fx1, Fx2 and the base members 21 deform, the pitches of the inter-digital electrodes 22D do not substantially change (if the pitches change, the pitch changes are sufficiently smaller than the pitch changes of the inter-digital electrodes 22C). Therefore, even when the forces Fx1, Fx2 are applied, the frequencies f4 of the force detection sensors 2A, 2B change little from the natural state. Further, in the force detection sensors 2C, 2D, the placement surfaces 213 are orthogonal to the directions of the forces Fx1, Fx2. Accordingly, even when the pressure receiving surfaces 211 are subjected to the forces Fx1, Fx2 and the base members 21 deform, the pitches of the inter-digital electrodes 22C do not substantially change (if the pitches change, the pitch changes are sufficiently smaller than the pitch changes of the inter-digital electrodes 22D). Therefore, even when the forces Fx1, Fx2 are applied, the frequencies f3 of the force detection sensors 2C, 2D change little from the natural state.

When the force Fy1 is applied to the pressure receiving surfaces 211, the base members 21 of the respective force detection sensors 2A, 2B, 2C, 2D shear-deform toward the positive side in the Y-axis direction. Thereby, the pitches of the inter-digital electrode 22D of the force detection sensor 2A and the inter-digital electrode 22C of the force detection sensor 2D become shorter than those in the natural state and the pitches of the inter-digital electrode 22D of the force detection sensor 2B and the inter-digital electrode 22C of the force detection sensor 2C become longer than those in the natural state. Accordingly, the frequency f4 of the force detection sensor 2A and the frequency f3 of the force detection sensor 2D become higher than those in the natural state, and the frequency f4 of the force detection sensor 2B and the frequency f3 of the force detection sensor 2C become lower than those in the natural state.

When the force Fy2 is applied to the pressure receiving surfaces 211, the base members 21 of the respective force detection sensors 2A, 2B, 2C, 2D shear-deform toward the negative side in the Y-axis direction. Thereby, the pitches of the inter-digital electrode 22D of the force detection sensor 2A and the inter-digital electrode 22C of the force detection sensor 2D become longer than those in the natural state and the pitches of the inter-digital electrode 22D of the force detection sensor 2B and the inter-digital electrode 22C of the force detection sensor 2C become shorter than those in the natural state. Accordingly, the frequency f4 of the force detection sensor 2A and the frequency f3 of the force detection sensor 2D become lower than those in the natural state, and the frequency f4 of the force detection sensor 2B and the frequency f3 of the force detection sensor 2C become higher than those in the natural state.

Therefore, the torque sensor 10B may detect the forces Fy1, Fy2 based on the changes (amounts of change and directions of change) of the frequencies f3, f4 of the force detection sensors 2A, 2B, 2C, 2D from the natural state. Note that, in the force detection sensors 2A, 2B, the placement surfaces 213 are orthogonal to the directions of the forces Fy1, Fy2. Accordingly, even when the pressure receiving surfaces 211 are subjected to the forces Fy1, Fy2 and the base members 21 deform, the pitches of the inter-digital electrodes 22C do not substantially change (if the pitches change, the pitch changes are sufficiently smaller than the pitch changes of the inter-digital electrodes 22D).

Therefore, even when the forces Fy1, Fy2 are applied, the frequencies f3 of the force detection sensors 2A, 2B change little from the natural state. Further, in the force detection sensors 2C, 2D, the placement surfaces 215 are orthogonal to the directions of the forces Fy1, Fy2. Accordingly, even when the pressure receiving surfaces 211 are subjected to the forces Fy1, Fy2 and the base members 21 deform, the pitches of the inter-digital electrode 22D do not substantially change (if the pitches change, the pitch changes are sufficiently smaller than the pitch changes of the inter-digital electrodes 22C). Therefore, even when the forces Fy1, Fy2 is the force applied to the torque sensor 10B may be easily specified. Specifically, as shown in the following table 5, combinations of the change directions of the frequencies f3, f4 of the respective force detection sensors 2A, 2B, 2C, 2D (whether the frequencies are higher or lower than those in the natural state) differ with respect to each of the forces Fz1, Fz2, Fx1, Fx2, Fy1, Fy2 and torque θz1, θz2. Accordingly, which (or a resultant force of at least two) of the forces Fz1, Fz2, Fx1, Fx2, Fy1, Fy2 and torque θz1, θz2 is the applied force may be easily specified using the differences.

TABLE 5

| | Frequency | | | | | | | |
|---|---|---|---|---|---|---|---|---|
| | Force detection sensor 2A | | Force detection sensor 2B | | Force detection sensor 2C | | Force detection sensor 2D | |
| | f3 | f4 | f3 | f4 | f3 | f4 | f3 | f4 |
| Fx1 | Higher | — | Lower | — | — | Higher | — | Lower |
| Fx2 | Lower | — | Higher | — | — | Lower | — | Higher |
| Fy1 | — | Higher | — | Lower | Lower | — | Higher | — |
| Fy2 | — | Lower | — | Higher | Higher | — | Lower | — |
| Fz1 | Higher | Higher | Higher | Higher | Higher | Higher | Higher | Higher |
| Fz2 | Lower | Lower | Lower | Lower | Lower | Lower | Lower | Lower |
| θz1 | Higher | Lower | Higher | Lower | Higher | Lower | Higher | Lower |
| θz2 | Lower | Higher | Lower | Higher | Lower | Higher | Lower | Higher | are applied, the frequencies f4 of the force detection sensors 2C, 2D change little from the natural state.

When the torque θz1 is applied to the pressure receiving surfaces 211, the base members 21 of the respective force detection sensors 2A, 2B, 2C, 2D torsionally deform in the forward direction about the Z-axis (in the clockwise direction as seen from the positive side of the Z-axis). Thereby, the pitches of the inter-digital electrodes 22C of the force detection sensors 2A, 2B, 2C, 2D become shorter than those in the natural state and, on the other hand, the pitches of the inter-digital electrodes 22D of the force detection sensor 2A, 2B, 2C, 2D become longer than those in the natural state. Accordingly, the frequencies f3 of the force detection sensors 2A, 2B, 2C, 2D become higher than those in the natural state, and the frequencies f4 of the force detection sensors 2A, 2B, 2C, 2D become lower than those in the natural state.

When the torque θz2 is applied to the pressure receiving surfaces 211, the base members 21 of the respective force detection sensors 2A, 2B, 2C, 2D torsionally deform in the backward direction about the Z-axis (in the counterclockwise direction as seen from the positive side of the Z-axis). Thereby, the pitches of the inter-digital electrodes 22C of the force detection sensors 2A, 2B, 2C, 2D become longer than those in the natural state and, on the other hand, the pitches of the inter-digital electrodes 22D of the force detection sensor 2A, 2B, 2C, 2D become shorter than those in the natural state. Accordingly, the frequencies f3 of the respective force detection sensors 2A, 2B, 2C, 2D become lower than those in the natural state, and the frequencies f4 of the respective force detection sensors 2A, 2B, 2C, 2D become higher than those in the natural state.

Therefore, the torque sensor 10B may detect the torque θz1, θz2 based on the changes (amounts of change and directions of change) of the frequencies f3, f4 of the respective force detection sensors 2A, 2B, 2C, 2D from the natural state.

As above, the force detection method of the torque sensor 10B is explained. Particularly, in the embodiment, which of the forces Fz1, Fz2, Fx1, Fx2, Fy1, Fy2 and torque θz1, θz2

As above, the torque sensor 10B of the embodiment is explained. The torque sensor 10B has the force detection sensors 2. Accordingly, the sensor may enjoy the above described advantages of the force detection sensors 2 and exert excellent reliability and detection property.

Note that the torque sensor 10B of the embodiment may detect the forces Fz, Fx, Fy in addition to the torque θz, i.e., is a composite sensor serving as a force sensor and a torque sensor. However, the torque sensor 10B is not limited to that, but may not have the function as a force sensor. In the embodiment, the torque sensor may detect θz as a rotation force about the Z-axis, however, may be adapted to further detect a rotation force about the X-axis and a rotation force about the Y-axis by calculation of the frequency changes of the respective force detection sensors 2A, 2B, 2C, 2D as appropriate, for example.

Further, in the embodiment, the torque sensor 10B has the four force detection sensors 2, however, the number of force detection sensors 2 is not particularly limited, but may be e.g. two, three, five or more.

Seventh Embodiment

Figure 14:
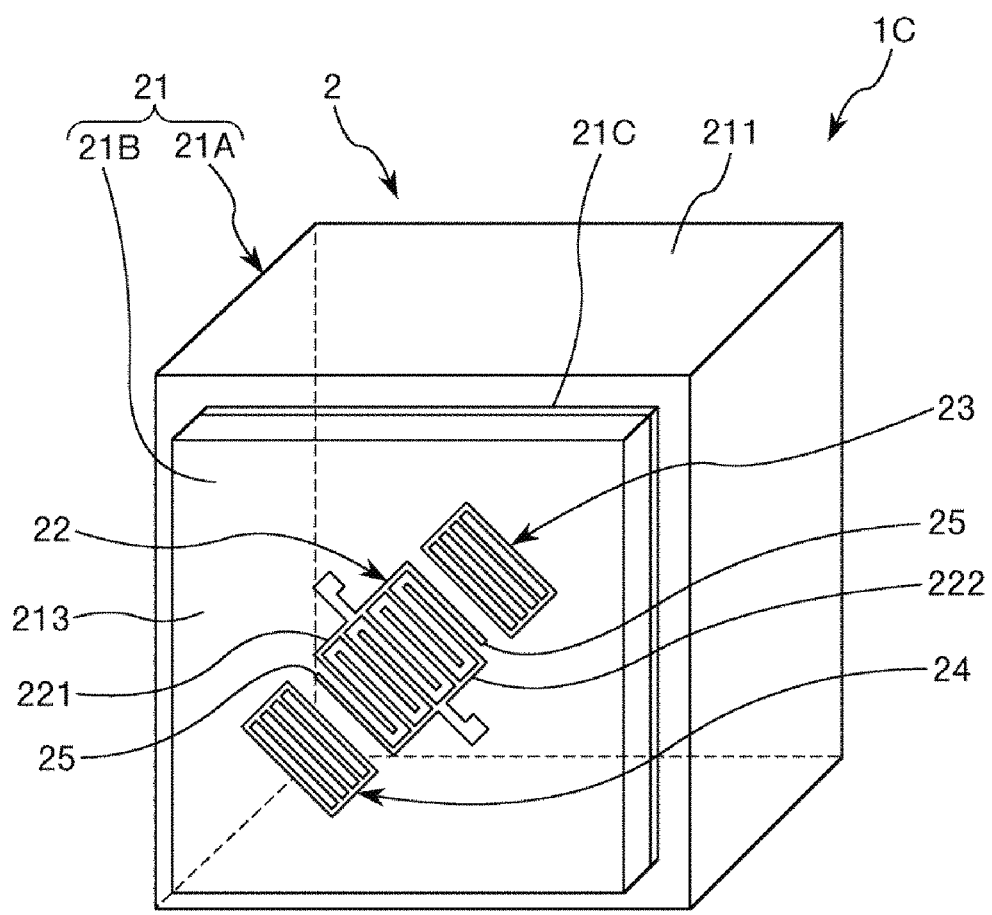
FIG. 14 is a perspective view of a force detection sensor of a force sensor according to a seventh embodiment of the invention.

FIG. 14 is a perspective view of a force detection sensor of a force sensor according to the seventh embodiment of the invention.

A force sensor 1C according to the embodiment is the same as the above described force sensor 1 of the first embodiment mainly except that the configuration of the force detection sensor 2 is different.

Note that, in the following explanation, the force sensor of the seventh embodiment will be described with a focus on the differences from the above described first embodiment and the description of the same items will be omitted. Further, in FIG. 14, the same configurations as those of the above described embodiments have the same signs.

As shown in FIG. 14, in the force detection sensor 2 of the force sensor 1C of the embodiment, the base member 21 has a first base member 21A and a second base member 21B connected to the first base member 21A. Further, the first base member 21A has the pressure receiving surface 211 as the first surface and the second base member 21B has the placement surface 213 as the second surface. That is, the base member has the first base member 21A as a part subjected to the forces Fz, Fx, etc. and pressurization and the second base member 21B with the inter-digital electrode 22 and the reflectors 23, 24 placed thereon as a part that functions as an SAW resonator, and the members are separately formed. As described above, the base member 21 is formed by the first base member 21A and the second base member 21B, and accordingly, constituent materials of the first base member 21A and the second base member 21B may be respectively appropriately selected. Thereby, the degree of freedom of design of the base member 21 is higher.

The constituent material of the first base member 21A is not particularly limited, but preferably a relatively hard material. The material includes e.g. various metals including iron, nickel, cobalt, gold, platinum, silver, copper, manganese, aluminum, magnesium, zinc, lead, tin, titanium, tungsten, alloys or intermetallic compounds containing at least one kind of the metals, or oxides, nitrides, carbides, etc. of the metals. On the other hand, the constituent material of the second base member 21B is not particularly limited as long as the material may excite surface acoustic wave, but various piezoelectric materials cited in the above described first embodiment may be used. Particularly, in the embodiment, the second base member 21B is formed using quartz crystal.

In the embodiment, the first base member 21A and the second base member 21B are connected (joined) via an adhesive 21C. The connecting method of the first base member 21A and the second base member 21B is not particularly limited as long as the force applied to the first base member 21A may be transmitted to the second base member 21B, but may be e.g. concavo-convex fitting, screwing using screws, welding, fusion, soldering, or the like.

According to the above described seventh embodiment, the same advantages as those of the above described first embodiment may be exerted.

Eighth Embodiment

Figure 15:
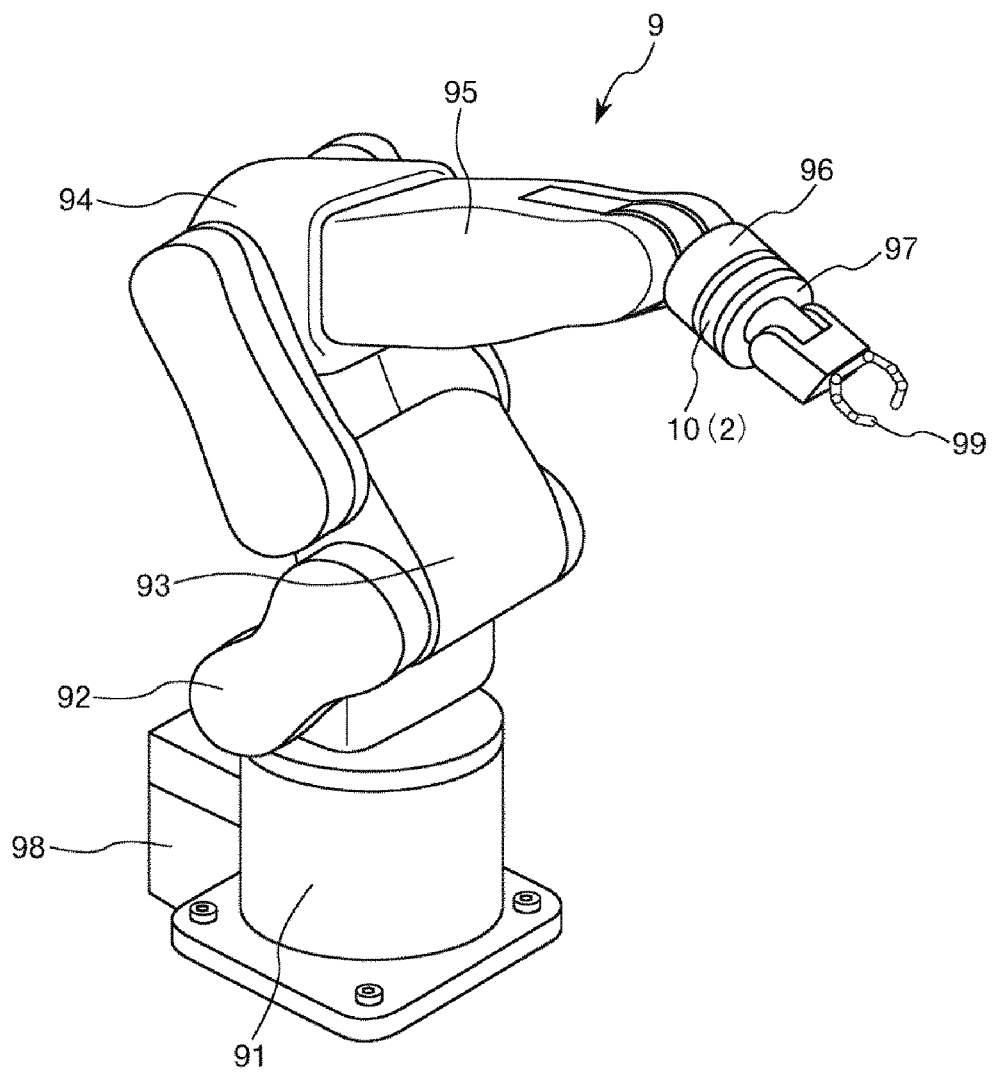
FIG. 15 is a perspective view showing a robot according to an eighth embodiment of the invention.

FIG. 15 is a perspective view showing a robot according to the eighth embodiment of the invention.

A robot 9 shown in FIG. 15 is a robot that may be used in e.g. a manufacturing process that manufactures industrial products such as precision apparatuses. As shown in the drawing, the robot 9 has a base 91 fixed to e.g. a floor or ceiling, an arm 92 rotatably coupled to the base 91, an arm 93 rotatably coupled to the arm 92, an arm 94 rotatably coupled to the arm 93, an arm 95 rotatably coupled to the arm 94, an arm 96 rotatably coupled to the arm 95, an arm 97 rotatably coupled to the arm 96, and a robot control unit 98 that controls driving of these arms 92, 93, 94, 95, 96, 97 and an end effector 99. Further, a hand connection part is provided in the arm 97 and the end effector 99 according to work to be executed by the robot 9 is attached to the hand connection part.

In the robot 9, as a sensor that detects an external force applied to the end effector 99, a torque sensor 10 including the above described force detection sensor 2 is provided. The force detected by the torque sensor 10 is fed back to the robot control unit 98, and thereby, the robot 9 may execute more precise work. Further, the robot 9 may sense contact of the end effector 99 with an object for work or an obstacle or the like by the force detected by the torque sensor 10. Accordingly, the operation of grasping and moving the object for work by the end effector 99 or the like may be performed more properly, obstacle avoidance operation, object damage avoidance operation, etc. that have been difficult in the position control of related art may be easily performed, and the robot 9 may execute work more properly and safely.

As described above, the robot 9 has the torque sensor 10 (force detection sensor 2). Accordingly, the robot may enjoy the above described advantages of the force detection sensor 2 and exert excellent reliability and detection property.

Note that the configuration of the robot 9 is not particularly limited, but the number of arms may be different from that of the embodiment, for example. Or, the robot 9 may be the so-called scalar robot or dual-arm robot. In the embodiment, the robot 9 has the torque sensor 10, however, may have the above described torque sensors 10A, 10B and force sensors 1, 1A, 1B, 1C instead, or may have another configuration.

As above, the force detection sensor, the force sensor, the torque sensor, and the robot according to the invention are explained with reference to the illustrated embodiments, however, the invention is not limited to those. The configurations of the respective parts may be replaced by arbitrary configurations having the same functions. Or, other arbitrary configurations may be added to the invention. Or, the respective embodiments may be combined as appropriate.

Further, in the above described embodiments, the configurations in which the force detection sensor is incorporated in the force sensor or torque sensor are explained, however, the force detection sensor is not necessarily incorporated in the sensors, but incorporated in another electronic device.

Furthermore, in the above described embodiments, each of the force sensor and the torque sensor has the package, pair of substrates, and pressurization bolts in addition to the force detection sensor, however, the configurations of the force sensor and the torque sensor are not particularly limited as long as the sensors have the force detection sensor elements. For example, the package may be omitted and the force detection sensor element may be directly sandwiched by the pair of substrates. Or, the pair of substrates and the pressurization bolts may be omitted. That is, the force detection sensor is not necessarily pressurized.

The entire disclosure of Japanese Patent Application No. 2016-228406, filed Nov. 24, 2016 is expressly incorporated by reference herein.

What is claimed is:

1. A force detection sensor comprising:
a base member having a first surface subjected to an external force acting along a first axis normal to the first surface and a second surface having a second axis normal to the second surface and in a direction different from the first axis normal to the first surface; and
electrode fingers placed on the second surface,
wherein an electrode finger axis extending a length of the electrode fingers is at an angle with respect to the direction of the first axis of the first surface in a plan view of the second surface, and
wherein the base member has a third surface having a third axis normal to the third surface and in a direction different from the first axis of the first surface and the second axis of the second surface,
the electrode fingers are placed on the third surface, and
an arrangement direction of the electrode fingers placed on the third surface is different from the direction of the first axis in a plan view of the third surface.

2. The force detection sensor according to claim 1, wherein the second surface includes a surface of a piezoelectric material.

3. The force detection sensor according to claim 2, wherein a constituent material of the piezoelectric material is quartz crystal.

4. The force detection sensor according to claim 3, wherein the first surface crosses an electrical axis of the quartz crystal.

5. The force detection sensor according to claim 1, wherein the third surface includes a surface of a piezoelectric material.

6. The force detection sensor according to claim 1, wherein the electrode fingers includes first electrode fingers and second electrode fingers, and, in the plan view of the second surface, a first electrode finger axis extending a length of the first electrode fingers is angled counterclockwise with respect to the first axis of the first surface and a second electrode finger axis extending a length of the second electrode fingers is angled clockwise with respect to the first axis of the first surface.

7. The force detection sensor according to claim 1, wherein the base member has a first base member and a second base member connected to the first base member,
the first base member has the first surface, and
the second base member has the second surface.

8. The force detection sensor according to claim 1, wherein the base member is pressurized.

9. The force detection sensor according to claim 1, wherein the electrode finger axis extending the length of the electrode fingers intersects a corner between the first surface, the second surface, and a third surface.

10. A force sensor comprising:
a first substrate;
a second substrate; and
a force detection sensor including:
    a base member having a first surface and a second surface, the first surface having a first axis normal to the first surface, the first surface being subjected to an external force, and the second surface having a second axis in a direction normal to the second surface and different from the first axis normal to the first surface; and
    electrode fingers placed on the second surface,
    wherein the base member has a third surface having a third axis normal to the third surface and in a direction different from the first axis of the first surface and the second axis of the second surface,
    a fourth axis extending a length of the electrode fingers is at an angle with respect to the direction of the first axis in a plan view of the second surface,
the electrode fingers are placed on the third surface, and
an arrangement direction of the electrode fingers placed on the third surface is different from the direction of the first axis in a plan view of the third surface,
the first substrate and the second substrate sandwiching the force detection sensor therebetween.

* * * * *